United States Patent
Chae et al.

(10) Patent No.: US 9,536,708 B2
(45) Date of Patent: Jan. 3, 2017

(54) PLASMA GENERATING DEVICE, METHOD OF CONTROLLING THE SAME, AND SUBSTRATE PROCESSING DEVICE INCLUDING THE PLASMA GENERATING DEVICE

(71) Applicant: PSK INC., Gyeonggi-do (KR)

(72) Inventors: Hee Sun Chae, Hwaseong-si (KR); Jeong Hee Cho, Hwaseong-si (KR); Jong Sik Lee, Hwaseong-si (KR); Han Saem Rhee, Hwaseong-si (KR); Hyun Jun Kim, Hwaseong-si (KR)

(73) Assignee: PSK Inc., Gyeonggi-Do (KR)

( * ) Notice: Subject to any disclaimer, the term of this patent is extended or adjusted under 35 U.S.C. 154(b) by 0 days.

(21) Appl. No.: 14/227,449

(22) Filed: Mar. 27, 2014

(65) Prior Publication Data

US 2014/0320017 A1    Oct. 30, 2014

(30) Foreign Application Priority Data

Apr. 25, 2013  (KR) .......................... 10-2013-0046076

(51) Int. Cl.
*H01J 37/32*    (2006.01)

(52) U.S. Cl.
CPC .......... *H01J 37/32183* (2013.01); *H01J 37/32* (2013.01); *H01J 37/321* (2013.01); *H01J 37/3211* (2013.01); *H01J 37/3299* (2013.01); *H01J 37/32174* (2013.01); *H01J 37/32357* (2013.01)

(58) Field of Classification Search
CPC ....................................................... H01J 37/32

USPC ............................ 315/111.21, 111.41, 111.51
See application file for complete search history.

(56) References Cited

U.S. PATENT DOCUMENTS

| 5,567,268 | A |   | 10/1996 | Kadomura |
|---|---|---|---|---|
| 5,907,221 | A | * | 5/1999 | Sato ...................... H01J 37/321 118/723 MP |
| 6,016,131 | A |   | 1/2000 | Sato et al. |
| 6,020,686 | A | * | 2/2000 | Ye ..................... H01J 37/32082 315/111.21 |

(Continued)

FOREIGN PATENT DOCUMENTS

| CN | 1437433 A | 8/2003 |
|---|---|---|
| CN | 101076220 A | 11/2007 |

(Continued)

*Primary Examiner* — Tung X Le
(74) *Attorney, Agent, or Firm* — Harness, Dickey & Pierce, P.L.C.

(57) ABSTRACT

Provided is a plasma generating device. The plasma generating device includes: an RF power supply providing an RF signal; a plasma chamber providing a space where gas is injected to generate plasma; a first electromagnetic inducer installed at one portion of the plasma chamber and inducing an electromagnetic field in the plasma chamber as the RF signal is applied; a second electromagnetic inducer installed at another portion of the plasma chamber and inducing an electromagnetic field in the plasma chamber as the RF signal is applied; a first load connected to the first electromagnetic inducer; a second load connected to the second electromagnetic inducer; and a controller controlling a power supplied to the first electromagnetic inducer and the second electromagnetic inducer by adjusting at least one impedance of the first load and the second load.

27 Claims, 16 Drawing Sheets

(56) References Cited

U.S. PATENT DOCUMENTS

| | | | |
|---|---|---|---|
| 6,180,019 B1 * | 1/2001 | Kazumi | H01J 37/32009 118/723 I |
| 7,190,119 B2 | 3/2007 | Patrick et al. | |
| 8,264,154 B2 * | 9/2012 | Banner | H01J 37/321 315/111.71 |
| 8,368,308 B2 * | 2/2013 | Banna | H01J 37/321 315/111.71 |
| 2002/0140359 A1 * | 10/2002 | Chen | H01J 37/321 315/111.21 |
| 2012/0211466 A1 | 8/2012 | Choi | |

FOREIGN PATENT DOCUMENTS

| | | |
|---|---|---|
| CN | 101390187 A | 3/2009 |
| CN | 102810444 A | 12/2012 |
| CN | 103037612 A | 4/2013 |
| JP | 07221078 A | 8/1995 |
| JP | 2000058296 A | 2/2000 |
| JP | 2004533090 A | 10/2004 |
| JP | 2005187860 A | 7/2005 |
| JP | 2006073354 A | 3/2006 |
| JP | 2009224388 A | 10/2009 |
| JP | 2014132570 A | 7/2014 |
| KR | 1020030030100 A | 4/2003 |
| KR | 1020050007624 A | 1/2005 |
| KR | 101062461 B1 | 9/2011 |
| TW | 1276372 B | 3/2007 |

\* cited by examiner

PLASMA GENERATING DEVICE, METHOD OF CONTROLLING THE SAME, AND SUBSTRATE PROCESSING DEVICE INCLUDING THE PLASMA GENERATING DEVICE

CROSS-REFERENCE TO RELATED APPLICATIONS

This U.S. non-provisional patent application claims priority under 35 U.S.C. §119 of Korean Patent Application No. 10-2013-0046076 filed on Apr. 25, 2013, the entire contents of which are hereby incorporated by reference.

BACKGROUND OF THE INVENTION

The present invention disclosed herein relates to a plasma generating device, a method of controlling the same, and a substrate processing device including the plasma generating device.

Processes for fabricating a semiconductor, a display, and a solar cell include a process for processing a substrate using plasma. For example, a etching device used for dry etch or an ashing device used for ashing during semiconductor fabricating processes includes a chamber for generating plasma and a substrate may be etched or ashed by using plasma generated by the chamber.

A typical plasma chamber includes a wound coil at a side and induces an electromagnetic field therein by flowing a time-varying current to the coil, thereby generating plasma. However, such a plasma chamber has a high density of plasma occurring at the center and a low density of plasma occurring at the edge.

That is, plasma is generated non-uniformly throughout a chamber space in a typical plasma chamber. As a result, plasma processing results are different at the center and edge of a substrate. The yield of a substrate processing process is deteriorated.

SUMMARY OF THE INVENTION

The present invention provides a plasma generating device for adjusting the uniformity of plasma generated in a chamber, a method of controlling the same, and a substrate processing device.

The present invention provides a plasma generating device for adjusting the uniformity of plasma generated in a chamber to improve the yield of a substrate processing process, a method of controlling the same, and a substrate processing device.

Embodiments of the present invention provide plasma generating devices including: an RF power supply providing an RF signal; a plasma chamber providing a space where gas is injected to generate plasma; a first electromagnetic inducer installed at one portion of the plasma chamber and inducing an electromagnetic field in the plasma chamber as the RF signal is applied; a second electromagnetic inducer installed at another portion of the plasma chamber and inducing an electromagnetic field in the plasma chamber as the RF signal is applied; a first load connected to the first electromagnetic inducer; a second load connected to the second electromagnetic inducer; and a controller controlling a power supplied to the first electromagnetic inducer and the second electromagnetic inducer by adjusting at least one impedance of the first load and the second load.

In some embodiments, the plasma chamber may include first and second pillar parts having different sizes of bottoms.

In other embodiments, the first pillar part may have a smaller bottom than the second pillar part; the first electromagnetic inducer may be installed at the first pillar part; and the second electromagnetic inducer may be installed at the second pillar part.

In still other embodiments, at least one of the first electromagnetic inducer and the second electromagnetic inducer may include a coil wound to an outer of the plasma chamber.

In even other embodiments, the first electromagnetic inducer and the second electromagnetic inducer may be connected in parallel to each other.

In yet other embodiments, the first load may include a first variable capacitor connected to an input terminal of the first electromagnetic inducer and the second load may include a second variable capacitor connected to an input terminal of the second electromagnetic inducer.

In further embodiments, the devices may further include a measurement unit measuring a capacitance of the first and second variable capacitors, wherein the controller may calculate an impedance of the first load and the second load on the basis of the measured capacitance.

In still further embodiments, the devices may further include a detection unit detecting an RF signal applied to the first and second electromagnetic inducers, wherein the controller may calculate a power supplied to the first and second electromagnetic inducers on the basis of data inputted from the detection unit.

In even further embodiments, the controller may supply a greater power to the first electromagnetic inducer as compared to the second electromagnetic inducer.

In yet further embodiments, the controller may control a power supplied to the first and second electromagnetic inducers according to a thin film thickness on a substrate processed using the plasma.

In yet further embodiments, the controller may increase a power supplied to the first electromagnetic inducer and reduce a power supplied to the second electromagnetic inducer when a thickness of a thin film formed in a center area of the substrate is greater than a thickness of a thin film formed in an edge area of the substrate; and may reduce a power supplied to the first electromagnetic inducer and increase a power supplied to the second electromagnetic inducer when a thickness of a thin film formed in an edge area of the substrate is greater than a thickness of a thin film formed in a center area of the substrate.

In yet further embodiments, the devices may further include: a third load connected to a ground terminal of the first electromagnetic inducer; and a fourth load connected to a ground terminal of the second electromagnetic inducer.

In yet further embodiments, the third load may include a third variable capacitor whose capacitance is adjusted by the controller; and the fourth load may include a fourth variable capacitor whose capacitance is adjusted by the controller.

In yet further embodiments, the controller may adjust an impedance of the third load to be the half of an impedance of the first electromagnetic inducer; and may adjust an impedance of the fourth load to be the half of an impedance of the second electromagnetic inducer.

In yet further embodiments, the controller may compare an RF signal applied to the first electromagnetic inducer with an RF signal applied to the third load and adjusts an impedance of the third load according to a comparison result; and may compare an RF signal applied to the second electromagnetic inducer with an RF signal applied to the fourth load and adjusts an impedance of the fourth load according to a comparison result.

In yet further embodiments, the controller may compare an amplitude of an RF signal applied to the first electromagnetic inducer with an amplitude of an RF signal applied to the third load; and may compare an amplitude of an RF signal applied to the second electromagnetic inducer with an amplitude of an RF signal applied to the fourth load.

In yet further embodiments, the controller, when the amplitude of the RF signal applied to the first electromagnetic inducer is greater than the amplitude of the RF signal applied to the third load, may increase an impedance of the third load; when the amplitude of the RF signal applied to the first electromagnetic inducer is less than the amplitude of the RF signal applied to the third load, may reduce an impedance of the third load; when the amplitude of the RF signal applied to the second electromagnetic inducer is greater than the amplitude of the RF signal applied to the fourth load, may increase an impedance of the fourth load; and when the amplitude of the RF signal applied to the second electromagnetic inducer is less than the amplitude of the RF signal applied to the fourth load, may reduce an impedance of the fourth load.

In other embodiments of the present invention, methods of controlling a plasma generating device include: receiving data on a first load connected to a first electromagnetic inducer and a second load connected to a second electromagnetic inducer; calculating a ratio of an impedance of the first load to an impedance of the second load; and adjusting at least one impedance of the first load and the second load to allow the ratio to be a predetermined target ratio.

In some embodiments, the receiving of the data on the first load and the second load may include receiving a capacitance of a variable capacitor included in the first load and a capacitance of a variable capacitor included in the second load.

In other embodiments, the first electromagnetic inducer may be installed at a first pillar part of a plasma chamber; and the second electromagnetic inducer may be installed at a second pillar part of the plasma chamber, wherein the second pillar part may have a greater bottom than the first pillar part.

In still other embodiments, the target ratio may be to set the impedance of the first load to be greater than the impedance of the second load.

In even other embodiments, the methods may further include adjusting at least one impedance of the first load and the second load according to a thin film thickness on a substrate processed using plasma.

In yet other embodiments, the adjusting of the at least one impedance of the first and second loads according to the thin film thicknesses may include: receiving data on a thin film thickness distribution on the substrate; and adjusting at least one impedance of the first and second loads according to the data on the thin film thickness distribution.

In further embodiments, the adjusting of the at least one impedance of the first and second loads according to the thin film thicknesses may include: receiving a thickness of a thin film formed in a center area of the substrate and a thickness of a thin film formed in an edge area of the substrate; when the thickness of the thin film formed in the center area of the substrate is greater than the thickness of the thin film formed in the edge area of the substrate, lowering an impedance of the first load or raising an impedance of the second load; and when the thickness of the thin film formed in the edge area of the substrate is greater than the thickness of the thin film formed in the center area of the substrate, raising an impedance of the first load or lowering an impedance of the second load.

In still other embodiments of the present invention, substrate processing devices include: a process unit, where a substrate is disposed, providing a space where a plasma process is performed; a plasma generating unit generating plasma from gas and supplying the plasma to the process unit; and a discharge unit discharging a process gas and a reaction by-product from the process unit, wherein the plasma generating unit includes: an RF power supply providing an RF signal; a plasma chamber providing a space where gas is injected to generate plasma; a first electromagnetic inducer installed at one portion of the plasma chamber and inducing an electromagnetic field in the plasma chamber as the RF signal is applied; a second electromagnetic inducer installed at another portion of the plasma chamber and inducing an electromagnetic field in the plasma chamber as the RF signal is applied; a first load connected to the first electromagnetic inducer; a second load connected to the second electromagnetic inducer; and a controller controlling a power supplied to the first electromagnetic inducer and the second electromagnetic inducer by adjusting at least one impedance of the first load and the second load.

In some embodiments, the plasma chamber may include first and second pillar parts having different sizes of bottoms.

In other embodiments, the first pillar part may have a smaller bottom than the second pillar part; the first electromagnetic inducer may be installed at the first pillar part; and the second electromagnetic inducer may be installed at the second pillar part.

In still other embodiments, the first electromagnetic inducer and the second electromagnetic inducer may be connected in parallel to each other.

In even other embodiments, the first load may include a first variable capacitor connected to an input terminal of the first electromagnetic inducer and the second load may include a second variable capacitor connected to an input terminal of the second electromagnetic inducer.

In yet other embodiments, the devices may further include a measurement unit measuring a capacitance of the first and second variable capacitors, wherein the controller may calculate an impedance of the first load and the second load on the basis of the measured capacitance.

In further embodiments, the devices may further include a detection unit detecting an RF signal applied to the first and second electromagnetic inducers, wherein the controller may calculate a power supplied to the first and second electromagnetic inducers on the basis of data inputted from the detection unit.

In still further embodiments, the controller may supply a greater power to the first electromagnetic inducer as compared to the second electromagnetic inducer.

In even further embodiments, the controller may control a power supplied to the first and second electromagnetic inducers according to a thin film thickness on a substrate processed using the plasma.

In yet further embodiments, the controller may increase a power supplied to the first electromagnetic inducer and reduce a power supplied to the second electromagnetic inducer when a thickness of a thin film formed in a center area of the substrate is greater than a thickness of a thin film formed in an edge area of the substrate; and may reduce a power supplied to the first electromagnetic inducer and increase a power supplied to the second electromagnetic inducer when a thickness of a thin film formed in an edge area of the substrate is greater than a thickness of a thin film formed in a center area of the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The effects and features of the present invention and methods of achieving them will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Unless otherwise defined, all terms (including technical or scientific terms) used herein have the same meanings generally accepted by universal techniques in the art. Terms defined by general dictionaries are interpreted as having the same meanings as that in related techniques and/or this specification and if not clearly defined, are not conceptualized or not be interpreted as being overly excessive.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. As used herein, the term and/or includes any and all combinations of one or more of the associated listed items.

The term '~unit', 'device', '~block', or '~module' may mean a unit for processing at least one function or operation. For example, the term '~unit', 'device', '~block', or '~module' may means a software component or a hardware component such as an FPGA or an ASIC. However, '~unit', 'device', '~block', or '~module' is not limited to software or hardware. '~unit', 'device', '~block', or '~module' may be configured to be stored on an addressable storage medium and may be configured to execute at least one processor.

Hereinafter, embodiments of the present invention will be described in more detail with reference to the accompanying drawings.

Figure 1:
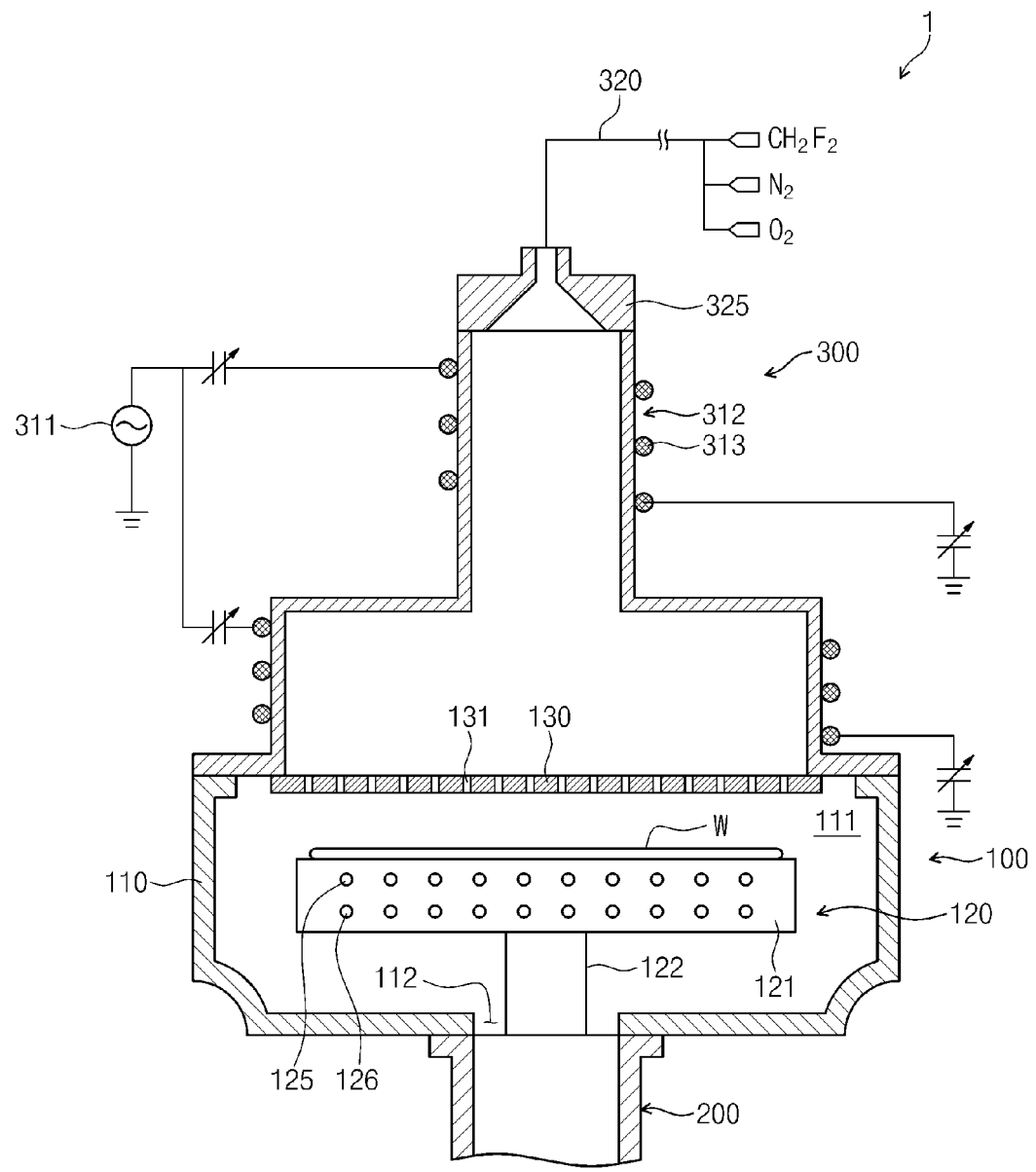
FIG. 1 is a view illustrating a substrate processing device using a plasma generating unit according to an embodiment of the present invention.

FIG. 1 is a view illustrating a substrate processing device using a plasma generating unit according to an embodiment of the present invention.

Referring to FIG. 1, the substrate processing device 1 may perform an etching or ashing operation on a thin film on a substrate W by using plasma. The thin film to be etched or ashed may be a nitride film. For example, the nitride film may be a silicon nitride film.

The substrate processing device 1 includes a process unit 100, a discharge unit 200, and a plasma generating unit 300. The process unit 100 may provide a space where a substrate is disposed and an etching or ashing process is performed. The discharge unit 200 discharges a process gas staying in the process unit 100 and reaction by-products occurring during substrate processing to the outside and maintains a pressure in the process unit 100 at a set pressure. The plasma generating unit 300 generates plasma from a process gas supplied from the outside and supplies the generated plasma to the process unit 100.

The process unit 100 includes a process chamber 110, a substrate supporting unit 120, and a baffle 130. A process space 111 for performing a substrate processing operation may be formed in the process chamber 110. In relation to the process chamber 110, an upper wall is opened and an opening (not shown) may be formed in a sidewall. The substrate W may enter the process chamber 110 through an opening. The opening may be opened/closed by an opening/closing member such as a door (not shown). A discharge hole 112 may be formed in the bottom of the process chamber 110. The discharge hole 112 is connected to the discharge unit 200 and provides a path through which gas staying in the process chamber 110 and reaction by-products are discharged to the outside.

The substrate supporting unit 120 may support the substrate W. The substrate supporting unit 120 includes a susceptor 121 and a support axis 122. The susceptor 121 may be disposed in the process space 111 and may have a disc shape. The susceptor 121 may be supported by the support axis 122. The substrate W may be disposed on the top of the susceptor 121. An electrode (not shown) may be provided in the susceptor 121. The electrode is connected to an external power and may generate electrostatic by applied power. The generated electrostatic may fix the substrate W to the susceptor 121. A heating member 125 may be provided in the susceptor 121. For example, the heating member 125 may be a heating coil. Additionally, a cooling member 126 may be provided in the susceptor 121. The cooling member 126 may be provided as a cooling line where coolant flows. The heating member 125 may heat the substrate W to a predetermined temperature. The cooling member 126 may cool the substrate W compulsorily. The process treatment completed substrate W may be cooled to a room temperature or a temperature required for the next process progress.

The baffle 130 may be disposed on the susceptor 121. Holes 131 may be formed in the baffle 130. The holes 131 may be provided as through holes penetrating from the top to the bottom of the baffle 130 and may be uniformly formed in each area of the baffle 130.

Again, referring to FIG. 1, the plasma generating unit 300 may be disposed on the process chamber 110. The plasma generating unit 300 may generate plasma by discharging a source gas and supplied the generated plasma to the process space 111. The plasma generating unit 300 includes a power supply 311, a plasma chamber 312, and a coil 313. Furthermore, the plasma generating unit 300 includes a source gas supplying unit 320.

The plasma chamber 312 may be disposed outside the process chamber 110. According to an embodiment of the present invention, the plasma chamber 312 may be disposed on the process chamber 110 and may be coupled to the process chamber 110. In the plasma chamber 312, a discharge space having the top and the bottom opened may be formed therein. The upper end of the plasma chamber 312 may be sealed by a gas supply port 325. The gas supply port 325 may be connected to a source gas supplying unit 320. A source gas may be supplied to a discharge space through the gas supply port 325. The source gas may include Difluoromethane (CH2F2), nitrogen (N2), and oxygen (O2). Selectively, the source gas may further include a different type of gas such as Tetrafluoromethane (CF4).

The coil 313 may be an inductively coupled plasma (ICP) coil. The coil 313 may be wound a plurality of times to the plasma chamber 312 from the outside. The coil 313 may be wounded to the plasma chamber 312 in an area corresponding to a discharge space. One end of the coil 313 may be connected to the power supply 311 and the other end may be grounded.

The power supply 311 may supply a high-frequency current to the coil 313. A high-frequency power supplied to the coil 313 may be applied to a discharge space. An induced electric field is formed by a high-frequency current in a discharge space and a source gas in the discharge space obtains an energy required for ionization from the induced electric field and changes into a plasma state.

The structure of the plasma generating unit 300 is not limited to the above embodiments and thus may use various structures for generating plasma from a source gas.

Figure 2:
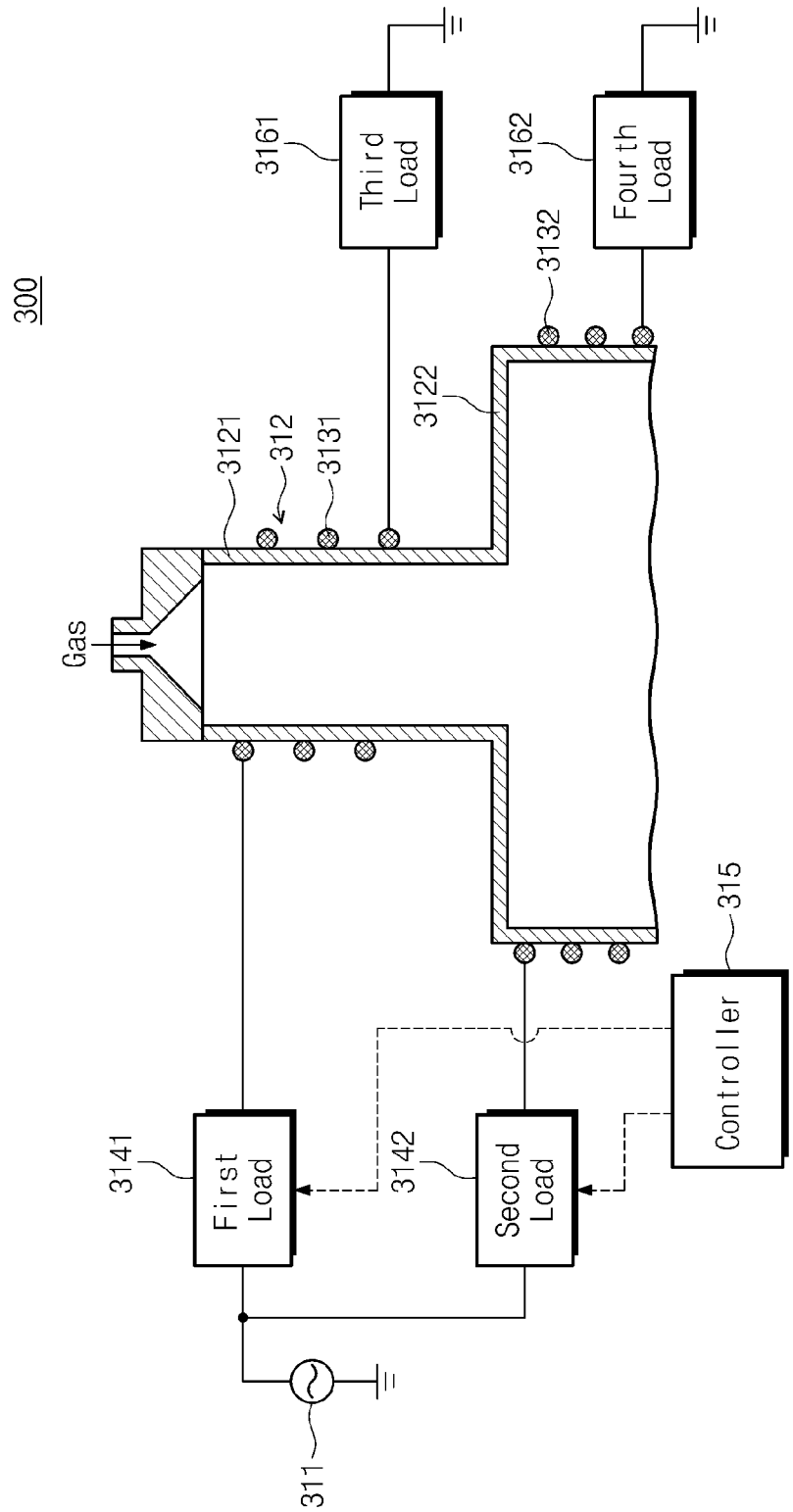
FIG. 2 is a view illustrating a plasma generating unit according to an embodiment of the present invention.

FIG. 2 is a view illustrating a plasma generating unit 300 according to an embodiment of the present invention.

As shown in FIG. 2, the plasma generating unit 300 includes an RF power supply 311, a plasma chamber 312, and electromagnetic field inducers 3131 and 3132.

The RF power supply 311 may provide an RF signal. The plasma chamber 312 may provide a space where gas is injected and plasma is generated. The electromagnetic field inducers 3131 and 3132 are installed at the plasma chamber 312 and induce an electromagnetic field in the plasma chamber 312 by receiving an RF signal.

According to an embodiment of the present invention, the RF power supply 311 may generate an RF signal and output the generated RF signal to the electromagnetic field inducers 3131 and 3132. The RF power supply 311 may deliver high-frequency power to the plasma chamber 312 through the RF signal. According to an embodiment of the present invention, the RF power supply 311 may generate and output a sine wave form of RF signal but the RF signal is not limited thereto. That is, the RF signal may have various waveforms such as square, triangle, saw tooth, and pulse waveforms, The plasma chamber 312 may provides a space where gas is injected and plasma is generated from the injected gas. According to an embodiment of the present invention, the plasma chamber 312 may change the gas injected to the plasma chamber 312 into a plasma state by using a high-frequency power delivered through an RF signal.

According to an embodiment of the present invention, the plasma chamber 312 include a first pillar part 3121 and a second pillar part 3122 having different sizes of bottoms.

Figure 3:
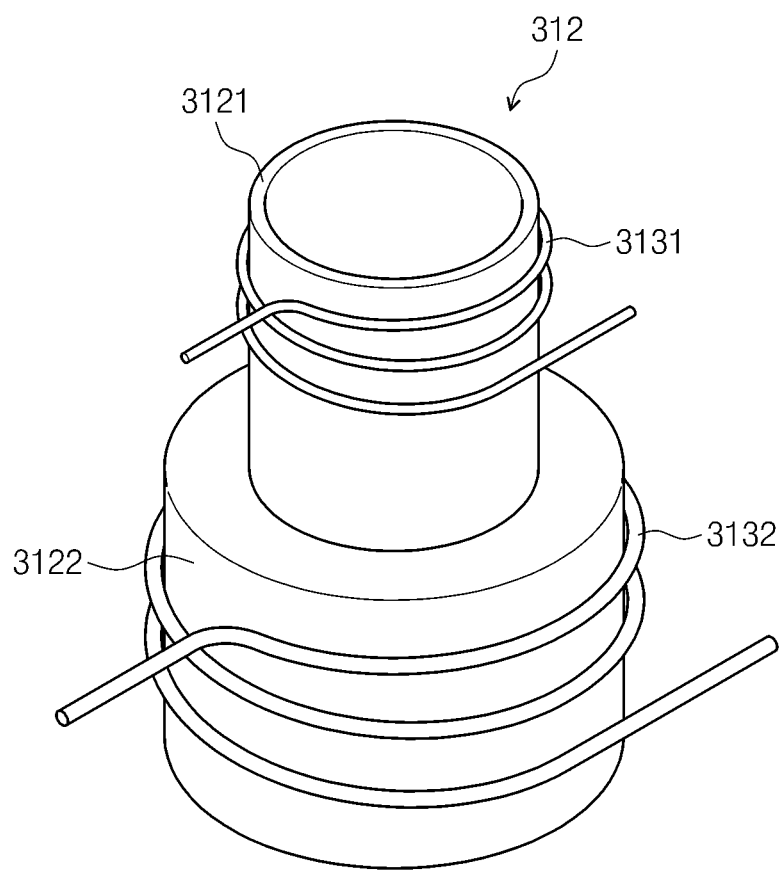
FIG. 3 is a perspective view illustrating a plasma chamber according to an embodiment of the present invention.

FIG. 3 is a perspective view illustrating the plasma chamber 312 according to an embodiment of the present invention.

As shown in FIG. 3, the plasma chamber 312 may include a first pillar part 3121 and a second pillar part 3122 having different sizes of bottoms. According to an embodiment of the present invention, the first pillar part 3121 has the bottom smaller than the second pillar part 3122 and the first pillar part 3121 may be connected to the second pillar part 3122.

As shown in the embodiment of FIG. 3, the first pillar part 3121 and the second pillar part 3122 have a cylindrical form but the present invention is not limited thereto. According to an embodiment, at least one of the first pillar part 3121 and the second pillar part 3122 may have a prism pillar form such as a square pillar form, a hexagonal pillar form, or an octagonal pillar form.

According to an embodiment of the present invention, the electromagnetic field inducer may include the first electromagnetic field inducer 3131 and the second electromagnetic field inducer 3132.

According to this embodiment of the present invention, as shown in FIGS. 2 and 3, the first electromagnetic field inducer 3131 may be installed at the first pillar part 3121 and the second electromagnetic field inducer 3132 may be installed at the second pillar part 3122.

According to an embodiment of the present invention, at least one of the first electromagnetic field inducer 3131 and the second electromagnetic field inducer 3132 may include a coil wounded to the outer of the plasma chamber 312.

For example, as shown in FIGS. 2 and 3, the first electromagnetic field inducer 3131 and the second electromagnetic field inducer 3132 may be coils respectively installed at the sides of the first pillar part 3121 and the second pillar part 3122. However, according to an embodiment of the present invention, at least one of the first electromagnetic field inducer 3131 and the second electromagnetic field inducer 3132 may be installed at the top of the pillar part 3121 or 3122.

According to another embodiment, at least one of the first electromagnetic field inducer 3131 and the second electromagnetic field inducer 3132 may be formed by winding a ferromagnetic core with a conducting wire and the ferromagnetic core wound by the conducting wire may be installed at the outer wall of the plasma chamber 312.

As mentioned above, according to an embodiment of the present invention, the plasma chamber 312 may include a plurality of pillar parts having different sizes of bottoms and an electromagnetic field inducer may be installed at each pillar part. According to the embodiments of FIGS. 2 and 3, the numbers of pillar parts and electromagnetic field inducers are two. However, according to another embodiment of the present invention, the number of pillar parts in the plasma chamber 312 and the number of electromagnetic field inducers installed at the plasma chamber 312 may be three or more.

According to an embodiment of the present invention, the first electromagnetic field inducer 3131 and the second electromagnetic field inducer 3132 may be connected in parallel to each other. For example, as shown in FIG. 2, the first electromagnetic field inducer 3131 and the second electromagnetic field inducer 3132 may be connected in parallel to one RF power supply 311 to receive an RF signal.

According to an embodiment of the present invention, the plasma generating unit 300 may include a plurality of RF power supplies and for example, the plasma generating unit 300 may include RF power supplies whose number is identical to that of the electromagnetic field inducers 3131 and 3132. In this case, each electromagnetic field inducer may be one-to-one connected to an RF power supply to receive an RF signal.

According to an embodiment of the present invention, the plasma generating unit 300 includes a first load 3141 connected to the first electromagnetic field inducer 3131 and a second load 3142 connected to the second electromagnetic field inducer 3132.

Figure 4:
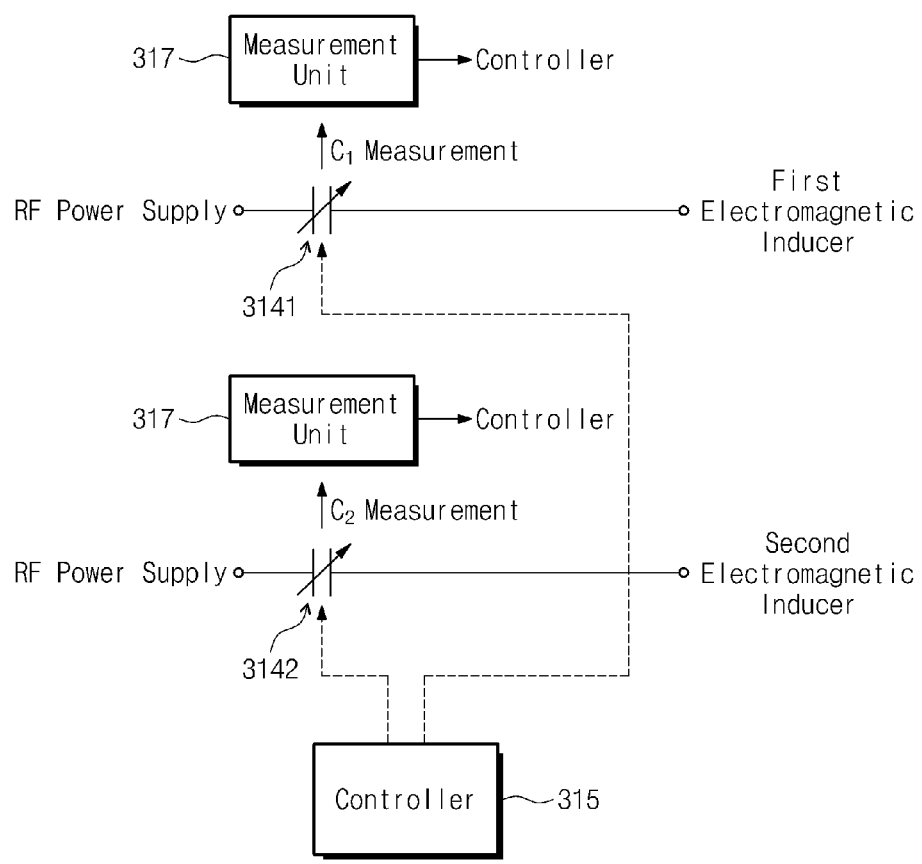
FIG. 4 is a view illustrating a first load and a second load according to an embodiment of the present invention.

FIG. 4 is a view illustrating the first load 3141 and the second load 3142 according to an embodiment of the present invention.

As shown in FIG. 4, the first load 3141 includes a first variable capacitor connected to an input terminal of the first electromagnetic field inducer 3131 and the second load 3142 includes a second variable capacitor connected to an input terminal of the second electromagnetic field inducer 3132. According to the embodiment of FIG. 4, the first load 3141 and the second load 3142 include a variable capacitor. However, according to another embodiment of the present invention, at least one of the first load 3141 and the second load 3142 may include various variable devices such as a variable inductor or a variable resistor.

According to an embodiment of the present invention, plasma generating unit 300 includes a controller 315 controlling a power supplied to the first electromagnetic field inducer 3131 and the second electromagnetic field inducer 3132 by adjusting at least one impedance of the first load 3141 and the second load 3142.

As shown in FIG. 4, when the first load 3141 and the second load 3142 include a variable capacitor, the controller 315 may adjust at least one impedance of the first load 3141 and the second load 3142 by adjusting a capacitance of the variable capacitor.

According to an embodiment of the present invention, the plasma generating unit 300 may further include a measurement unit 317 for measuring a capacitance of the first and second variable capacitors. In this case, the controller 315 may receive data on a capacitance from the measurement unit 317 and may calculate an impedance of the first load 3141 and the second load 3142 on the basis of the inputted capacitance.

The measurement unit 317 may include an RLC meter but is not limited thereto. An arbitrary measurement device for measuring a device value may be used.

Figure 5:
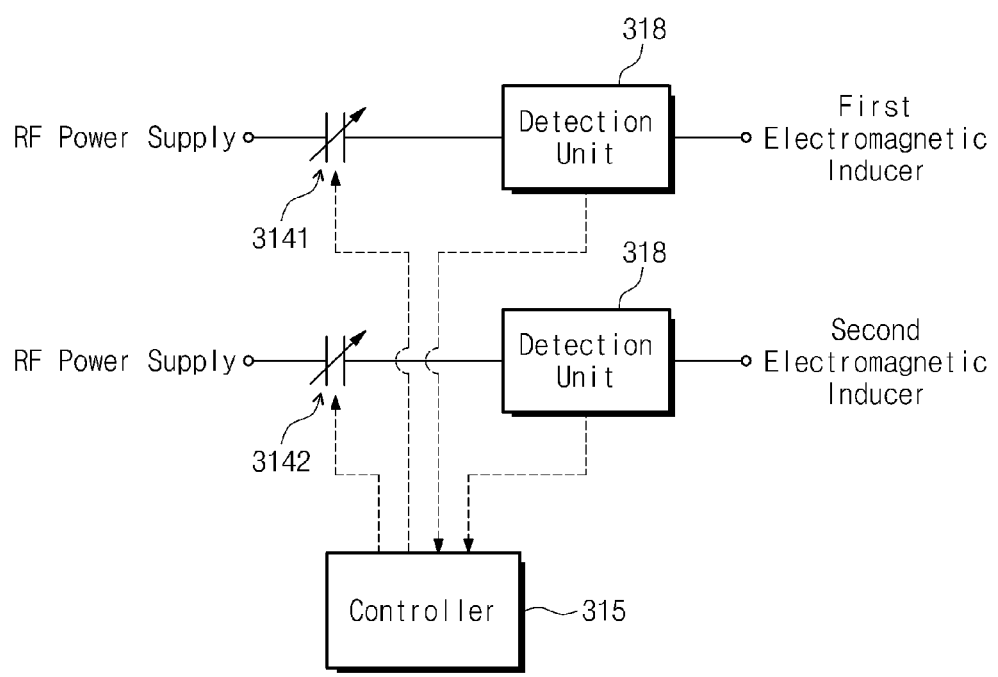
FIG. 5 is a view illustrating a plasma generating unit according to another embodiment of the present invention.

FIG. 5 is a view illustrating a plasma generating unit 300 according to another embodiment of the present invention.

As shown in FIG. 5, the plasma generating unit 300 further includes a detection unit 318 for detecting an RF signal applied to the first electromagnetic field inducer 3131 and the second electromagnetic field inducer 3132. In this case, the controller 315 may receive data on an RF signal from the detection unit 318 and may calculate a power supplied to the first electromagnetic field inducer 3131 and the second electromagnetic field inducer 3132 on the basis of the inputted data.

The detection unit 318 may include a sensor detecting at least one of a voltage, current, phase, and frequency of an RF signal but parameters detected by a detection unit are not limited thereto.

According to an embodiment of the present invention, the controller 315 may provide greater power to the second electromagnetic field inducer 3132 as compared to the first electromagnetic field inducer 3131.

For example, as shown in FIGS. 2 and 3, due to the first pillar part 3121 and the second pillar part 3122 having different sizes of bottoms, if the lengths of coils configuring the first electromagnetic field inducer 3131 and the second electromagnetic field inducer 3132 are different, in order to generate plasma in a chamber uniformly, it is necessary to provide greater power to the second electromagnetic field inducer 3132 as compared to the second electromagnetic field inducer 3131. In this case, the controller 315 may distribute power to the first and second electromagnetic field inducers 3131 and 3132 by a predetermined ratio according to an impedance of the first and second electromagnetic field inducers 3131 and 3132.

Thus, the controller 315 may control a power supplied to first and second electromagnetic field inducers so as to uniformly generate plasma in a plasma chamber. Also, the controller 315 may control power supply so as to non-uniformly generate plasma in a plasma chamber.

According to an embodiment of the present invention, the controller 315 may control a power supplied to the first and second electromagnetic field inducers 3131 and 3132 according to a the thickness of a thin film on a substrate processed using plasma.

Figure 6:
FIGS. 6 to 8 are views illustrating a thickness distribution of a thin film formed on a substrate according to an embodiment of the present invention.
Figure 7:
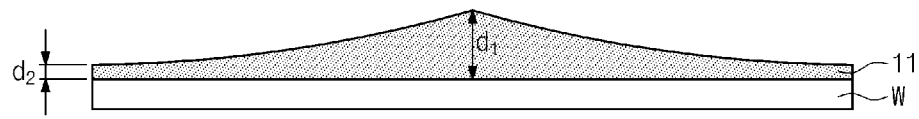
Figure 8:
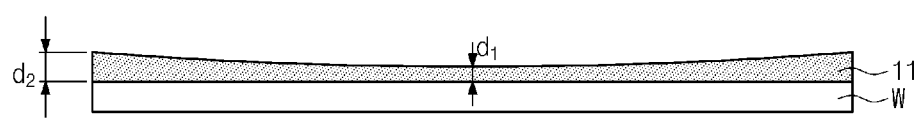

FIGS. 6 to 8 are views illustrating a thickness distribution of a thin film formed on a substrate according to an embodiment of the present invention.

According to an embodiment of the present invention, as shown in FIG. 6, the thin film 11 may be uniformly formed on the substrate W processed using plasma. That is, the thickness d of the thin film 11 may be uniformly distributed over the substrate W.

In this case, the controller 315 may supply power to the first and second electromagnetic field inducers 3131 and 3132 by a ratio preset to uniformly generate plasma in a plasma chamber.

However, according to another embodiment of the present invention, as shown in FIGS. 7 and 8, the thin film 11 may be non-uniformly formed on the substrate W. For example, as shown in FIG. 7, the thickness d1 of a thin film formed at the center area of the substrate W may be greater than the thickness d2 of a thin film formed at the edge area of the substrate W. On the contrary, the thickness d2 of a thin film formed at the edge area of the substrate W may be greater than the thickness d1 of a thin film formed at the center area of the substrate W In this case, the controller 315 may control power supply to non-uniformly generate plasma in a chamber according to a thickness distribution of a thin film formed on the substrate W.

According to an embodiment of the present invention, when the thickness d1 of a thin film formed at the center area of the substrate W is greater than the thickness d2 of a thin film formed at the edge area of the substrate W, the controller 315 may increase a power supplied to the first electromagnetic field inducer 3131 or may reduce a power supplied to the second electromagnetic inducer 3132.

That is, with respect to the substrate W introduced to a chamber for plasma processing, in order to increase the density of plasma generated at the center area of the substrate W to be higher than that generated at the edge area of the substrate W, the controller 315 may increase a power supplied to the first electromagnetic field inducer 3131 or may reduce a power supplied to the second electromagnetic inducer 3132.

As a result, there may be a difference in the thickness of a thin film etched or ashed by plasma in the center area and the edge area of the substrate W, and in more detail, a thin film formed at the center area of the substrate W may be etched or ashed deeper than a thin film formed at the edge area of the substrate W.

On the contrary, according to another embodiment of the present invention, when the thickness d2 of a thin film formed at the edge area of the substrate W is greater than the thickness d1 of a thin film formed at the center area of the substrate W, the controller 315 may reduce a power supplied to the first electromagnetic field inducer 3131 or may increase a power supplied to the second electromagnetic inducer 3132.

As a result, the density of plasma generated at the edge area of the substrate W in a chamber becomes higher than the density of plasma generated at the center area, so that a thin film formed at the edge area may be etched or ashed deeper than a thin film formed at the center area.

The controller 315 may receive data on the thickness of a thin film on the substrate W from a measurement unit for measuring the thickness of a thin film on the substrate W and on the basis of the received data, may control the amount of power supplied to the first and second electromagnetic field inducers 3131 and 3132.

According to an embodiment of the present invention, the controller 315 may receive the thickness d1 of a thin film formed at the center of the substrate W and the thickness d2 of a thin film formed at the edge of the substrate W.

According to another embodiment of the present invention, the controller 315 receive the thicknesses of a thin film formed at a plurality of points on the substrate W and on the basis of this, may calculate the thicknesses of a thin film formed at the center area and the edge area of the substrate W.

Figure 9:
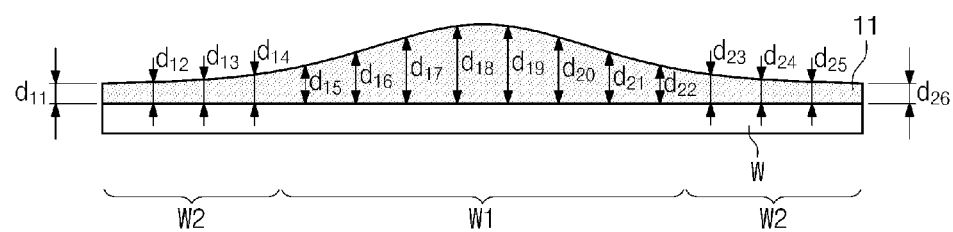
FIG. 9 is a view illustrating a process of measuring the thickness of a thin film from a plurality of points on a substrate according to an embodiment of the present invention.

FIG. 9 is a view illustrating a process of measuring the thickness of a thin film from a plurality of points on a substrate W according to an embodiment of the present invention.

As shown in FIG. 9, the measurement unit may measure the thicknesses d11, d12, d13, d14, d15, d16, d17, d18, d19, d20, d21, d22, d23, d24, d25, and d26 of a thin film along the diameter of the substrate W. The measured thicknesses of a thin film at a plurality of points are transmitted to the controller 315. The controller 315 may calculate the thicknesses of a thin film formed at the center area and the edge area of the substrate W.

For example, the controller 315 may divide the substrate W into the center area W1 and the edge area W2 on the basis of the diameter of the substrate W, calculate an average value of the thicknesses of a thin film measured from each area, and provide the calculated average value as a thin film thickness in a corresponding area.

Here, the center area W1 of the substrate W may correspond to the bottom of the first pillar part 3121 where the first electromagnetic inducer 3131 is installed. For example, the center area W1 may be identical to the bottom area of the first pillar part 3121 or the diameter of the center area W1 may be identical to the diameter or side length of the bottom of the first pillar part 3121.

Referring to FIG. 9, the controller 315 obtains the thin film thickness of the center area W1 by calculating an average value of the thin film thicknesses d15, d16, d17, d18, d19, d20, d21, and d22 measured at the center area W1 of the substrate W and obtains the thin film thickness of the edge area W2 by calculating an average value of the thin film thicknesses d11, d12, d13, d14, d23, d24, d25, and d26.

According to an embodiment of the present invention, instead of the calculating an average, the controller 315 may calculate the maximum value, the minimum value, the median value, and the most frequent value among a plurality of thin film thicknesses measured at each area and then may determine them as a thin film thickness in a corresponding area.

Figure 10:
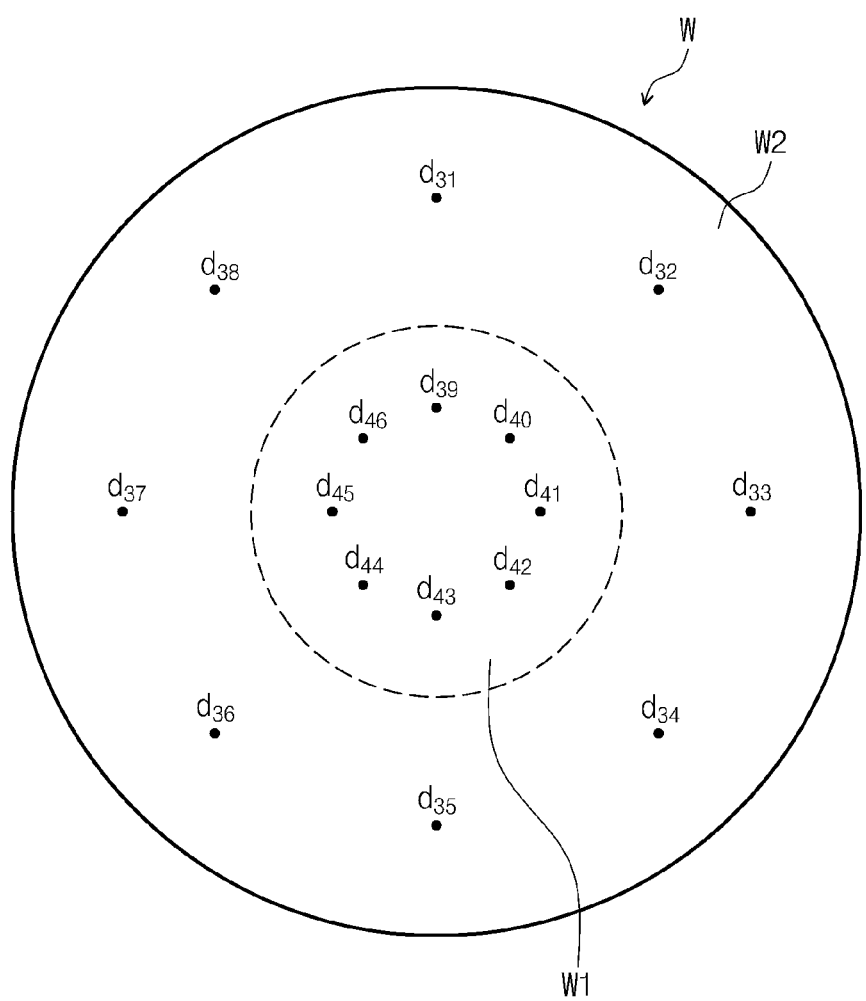
FIG. 10 is a view illustrating a process of measuring the thickness of a thin film from a plurality of points on a substrate according to an embodiment of the present invention.

According to the embodiment of FIG. 9, the thin film thicknesses of a total of 16 points are measured but the number of points for measuring thin film thicknesses is not limited thereto. Additionally, according to the embodiment of FIG. 9, thin film thicknesses are measured from a plurality of points along the diameter of one side of the substrate W. However, according to another embodiment of the present invention, as shown in FIG. 10, the measurement unit may measure thin film thicknesses from a plurality of points d31, d32, d33, d34, d35, d36, d37, d38, d39, d40, d41, d42, d43, d44, d45, and 46 along the circumference on the plane of the substrate W.

Referring to FIG. 2 again, according to an embodiment of the present invention, the plasma generating unit 300 includes a third load 3161 connected to the first electromagnetic field inducer 3131 and a fourth load 3162 connected to the second electromagnetic field inducer 3132.

Figure 11:
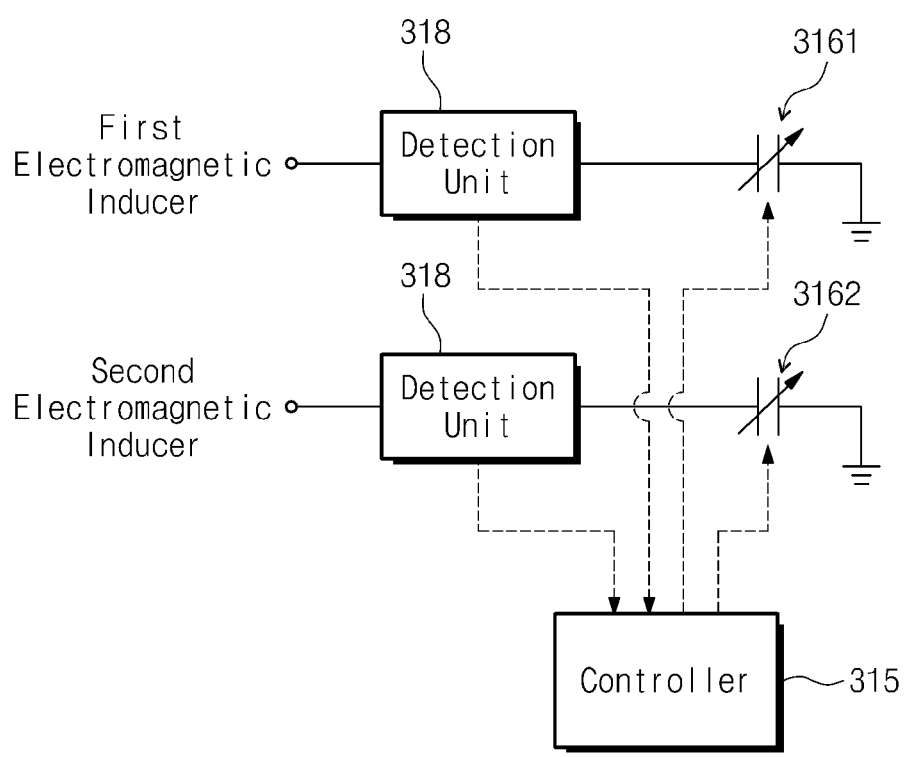
FIG. 11 is a view illustrating a third load and a fourth load according to an embodiment of the present invention.

FIG. 11 is a view illustrating the third load 3161 and the fourth load 3142 according to an embodiment of the present invention.

As shown in FIG. 11, the first load 3161 includes a third variable capacitor having a capacitance adjusted by the controller 315 and the fourth load 3162 includes a fourth variable capacitor having a capacitance adjusted by the controller 315.

According to an embodiment of the present invention, at least one of the third load 3161 and the fourth load 3162 may include a variable device having a variable device value such as a variable inductor or a variable resistor.

According to an embodiment of the present invention, the controller 315 may adjust the impedance of the third load 3161 to allow it to be the half of the impedance of the first electromagnetic inducer 3131 and the impedance of the fourth load 3162 to allow it to be the half of the impedance of the second electromagnetic inducer 3132.

For example, the controller 315 may adjust the impedance of the third load 3161 to allow it to be the half of the impedance of the first electromagnetic inducer 3131 and the impedance of the fourth load 3162 to allow it to be the half of the impedance of the second electromagnetic inducer 3132, by changing the capacitances of the third and fourth variable capacitors.

In this embodiment, the controller 315 may obtain information on a frequency ω of an RF signal and, on the basis of the inductances of the first and second electromagnetic inducers 3131 and 3132, may calculate the impedances of the first and second electromagnetic inducers 3131 and 3132. Then, the controller 315 may calculate the capacitances of the third and fourth variable capacitors adjusting the impedances of the third and fourth loads 3161 and 3162 to be the half of the impedances of the first and second electromagnetic inducers 3131 and 3132 and then, may control the third and fourth variable capacitors so that they have the calculated capacitances.

According to another embodiment of the present invention, the controller 315 may compare an RF signal applied to the first and second electromagnetic inducers 3131 and 3132 with an RF signal applied to the third and fourth loads 3161 and 3162 and, on the basis of a comparison result, may adjust the impedances of the third and fourth loads 3161 and 3162.

According to this embodiment of the present invention, the controller 315 may compare a voltage amplitude of an RF signal applied to the first and second electromagnetic inducers 3131 and 3132 with a voltage amplitude of an RF signal applied to the third and fourth loads 3161 and 3162. According to an embodiment of the present invention, the controller 315 may compare the amplitude of a current applied to the first and second electromagnetic inducers 3131 and 3132 with the amplitude of a current applied to the third and fourth loads 3161 and 3162, compare an average voltage or the magnitude of a current applied to the first and second electromagnetic inducers 3131 and 3132 with an average voltage or the magnitude of a current applied to the third and fourth loads 3161 and 3162, or compare an rms voltage or the magnitude of a current applied to the first and second electromagnetic inducers 3131 and 3132 with an rms voltage or the magnitude of a current applied to the third and fourth loads 3161 and 3162.

According to an embodiment of the present invention, if the amplitude of an RF signal applied to the first and second electromagnetic inducers 3131 and 3132 is greater than the amplitude of an RF signal applied to the third and fourth loads 3161 and 3162, the controller 315 may increase the impedances of the third and fourth loads 3161 and 3162. Additionally, if the amplitude of an RF signal applied to the first and second electromagnetic inducers 3131 and 3132 is less than the amplitude of an RF signal applied to the third and fourth loads 3161 and 3162, the controller 315 may decrease the impedances of the third and fourth loads 3161 and 3162.

Figure 12:
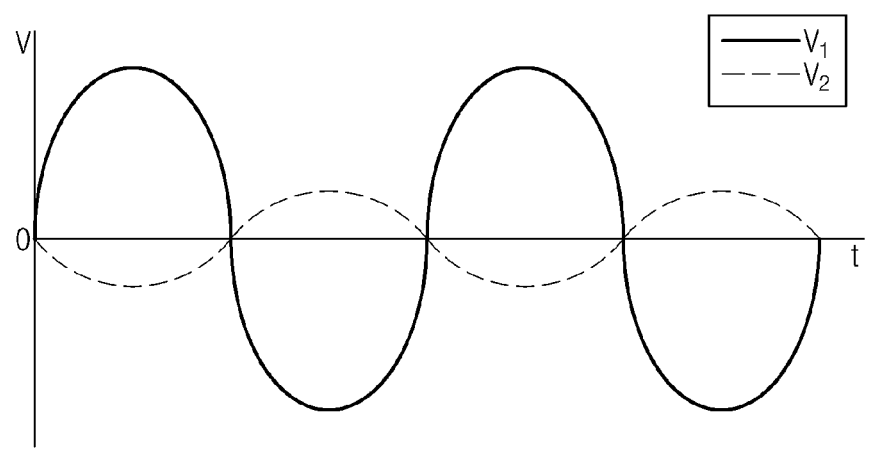
FIGS. 12 and 13 are graphs illustrating a voltage waveform at both ends of an electromagnetic inducer when an unbalanced voltage is applied to the electromagnetic inducer according to an embodiment of the present invention.
Figure 13:
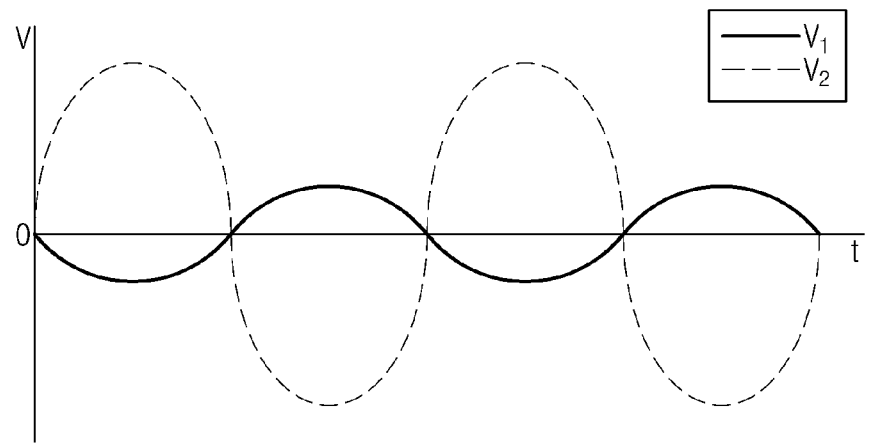
Figure 14:
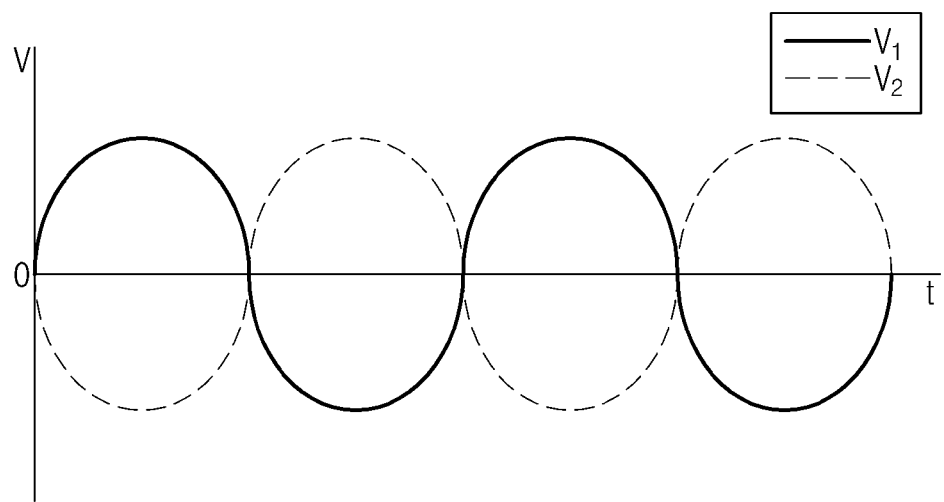
FIG. 14 is a graph illustrating a voltage waveform at both ends of an electromagnetic inducer when a balanced voltage is applied to the electromagnetic inducer according to an embodiment of the present invention.

FIGS. 12 and 13 are graphs illustrating a voltage waveform at both ends of an electromagnetic inducer when the magnitudes of voltages are different at the both ends of the electromagnetic inducer, that is, an unbalanced voltage is applied to the electromagnetic inducer, according to an embodiment of the present invention.

As shown in FIG. 12, if the amplitude of a voltage V1 measured at the input terminals of the first and second electromagnetic inducers 3131 and 3132 is greater than a voltage V2 measured at the input terminals of the third and fourth loads 3161 and 3162, the controller 315 may increase the impedances of the third and fourth loads 3161 and 3162 after outputting a control signal to the third and fourth loads 3161 and 3162.

On the contrary, if the amplitude of a voltage V1 measured at the input terminals of the first and second electromagnetic inducers 3131 and 3132 is less than a voltage V2 measured at the input terminals of the third and fourth loads 3161 and 3162, the controller 315 may decrease the impedances of the third and fourth loads 3161 and 3162 after outputting a control signal to the third and fourth loads 3161 and 3162.

FIG. 13 is a graph illustrating a voltage waveform at both ends of an electromagnetic inducer when the magnitudes of voltages are the same at the both ends of the electromagnetic inducer, that is, a balanced voltage is applied to the electromagnetic inducer, according to an embodiment of the present invention.

As mentioned above, shown in FIG. 12, if the controller 315 adjusts the impedances of the third and fourth loads 3161 and 3162 so that the amplitude of a voltage V1 applied to the first and second electromagnetic inducers 3131 and 3132 becomes identical to a voltage V2 applied to the third and fourth loads 3161 and 3162, a balanced voltage may be applied to the first and second electromagnetic inducers 3131 and 3132.

Referring to FIG. 11 again, the plasma generating unit 300 includes the third and fourth loads 3161 and 3162 and the detection unit 318 connected to the input terminals of the third and fourth loads 3161 and 3162 and configured to detect an RF signal applied to the third and fourth loads 3161 and 3162.

According to an embodiment of the present invention, the detection unit 318 may detect at least one of the voltage, current, phase, and frequency of an RF signal and may then deliver data on the detected RF signal to the controller 315. The controller 315 may adjust the impedances of the third and fourth loads 3161 and 3162 on the basis of the received data on the RF signal from the detection unit 318.

According to an embodiment of the present invention, the controller 315 may adjust a ratio of the impedances of the first and second electromagnetic inducers 3131 and 3132 to the impedances of the third and fourth loads 3161 and 3162 repeatedly at a predetermined period.

For example, the controller 315 may monitor an RF signal applied to the first and second electromagnetic inducers 3131 and 3132 an RF signal applied to the third and fourth loads 3161 and 3162 periodically and, based on a monitoring result, may adjust the impedances of the third and fourth loads 3161 and 3162 repeatedly. An impedance adjustment period of the third and fourth loads 3161 and 3162 may be set with various values according to an embodiment of the present invention.

According to another embodiment of the present invention, when at least one of the amplitude, phase, and frequency of an RF signal changes, the controller 315 may adjust the ratio. During a plasma processing operation, at least one of the characteristics, for example, the amplitude, the phase, and the frequency, of an RF signal outputted from the RF power supply 311 may change and in this case, the magnitude of a voltage applied to the both ends of an electromagnetic inducer changes, so that an unbalanced voltage may be applied to the electromagnetic inducer.

Accordingly, the controller 315 may monitor an RF signal outputted from the RF power supply 311 to detect a characteristic change of the RF signal or receive information for notifying that the characteristics of the RF signal change and accordingly, may compare the voltages V1 and V2 and adjust the impedances of the third and fourth loads 3161 and 3162.

According to another embodiment of the present invention, when at least one of the Ingredient, composition, and pressure of a gas injected to the plasma chamber 312 changes, the controller 315 may adjust the ratio. During a plasma processing operation, at least one of the characteristics, for example, the Ingredient, the composition, and the pressure, of a gas injected to the plasma chamber 312 may change and in this case, the magnitude of a voltage applied to the both ends of an electromagnetic inducer changes, so that an unbalanced voltage may be applied to the electromagnetic inducer.

Accordingly, the controller 315 may receive information for notifying a gas injected to the plasma chamber 312 changes and accordingly, may compare the voltages V1 and V2 and adjust the impedances of the third and fourth loads 3161 and 3162.

According to an embodiment of the present invention, while the controller 315 adjusts the impedances of the third and fourth loads 3161 and 3162 periodically, if the characteristic of an RF signal changes or a gas injected to the plasma chamber 312 changes, the controller 315 may additionally adjust the impedances of the third and fourth loads 3161 and 3162. As a result, a balanced voltage may be continuously maintained at the both ends of the first and second electromagnetic inducers 3131 and 3132 during a plasma processing operation.

Figure 15:
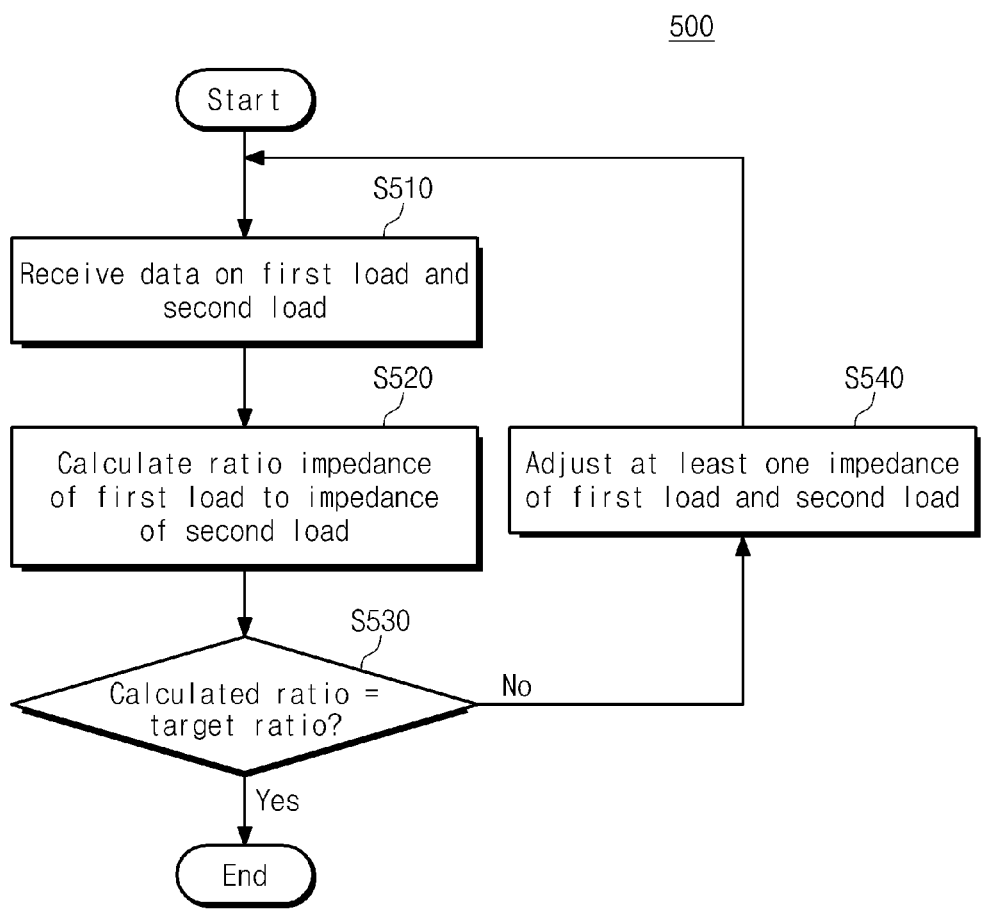
FIG. 15 is a flowchart illustrating a method of controlling a plasma generating unit according to an embodiment of the present invention.

FIG. 15 is a flowchart illustrating a method of controlling the plasma generating unit 300 according to an embodiment of the present invention.

As shown in FIG. 15, the method 500 of controlling a plasma generating unit includes receiving data on the first load 3141 connected to the first electromagnetic inducer 3131 and the second load 3142 connected to the second electromagnetic inducer 3132 in operation S510, calculating a ratio of the impedance of the first load 3141 to the impedance of the second load 3142 in operation S520, and adjusting at least one impedance of the first load 3141 and the second 3142 to allow the calculated ratio to be a predetermined target ratio in operation S540.

According to an embodiment of the present invention, the receiving of the data on the first load 3141 and the second load 3142 in operation S510 includes receiving the capacitance of a variable capacitor in the first load 3141 and the capacitance of a variable capacitor in the second load 3142. The capacitance may be received from a measurement unit for measuring a device value of the variable capacitor, for example, an RLC meter.

As described with reference to FIGS. 2 and 3, the first electromagnetic field inducer 3131 may be installed at the first pillar part 3121 of the plasma chamber and the second electromagnetic field inducer 3132 may be installed at the second pillar part 3122 of the plasma chamber. Additionally, the second pillar part 3122 has the greater bottom than the first pillar part 3121.

According to an embodiment of the present invention, the first electromagnetic inducer 3131 may contribute to plasma generation to process the center area W1 of the substrate W and the second electromagnetic inducer 3132 may contribute to plasma generation to process the edge area W2 of the substrate W.

In order to uniformly perform an etching or ashing process on the entire substrate W, plasma needs to be generated uniformly in a chamber. According to an embodiment of the present invention, the length of a coil configuring the second electromagnetic inducer 3132 may be longer than the length of a coil configuring the first electromagnetic inducer 3131, and accordingly, in order to generate uniform plasma in a chamber, greater power may be supplied to the second electromagnetic inducer 3132 as compared to the first electromagnetic inducer 3132.

For this, according to the method 500 of controlling a plasma generating unit, in relation to a target ratio of the impedance of the first load 3141 and the impedance of the second load 3142, the impedance of the first load 3141 may be set higher than the impedance of the second load 3142. As a result, greater power may be supplied to the second electromagnetic inducer 3132 as compared to the first electromagnetic inducer 3131 and plasma is uniformly generated in the chamber.

According to another embodiment of the present invention, non-uniform plasma may be required in the chamber according to a process. For example, if the thickness of a thin film processed using plasma is non-uniform over the substrate W, an etching or ashing rate may be adjusted by generating plasma non-uniformly in the chamber.

According to this embodiment, the method 500 of controlling a plasma generating unit further includes adjusting at least one impedance of the first load 3141 and the second load 3142 according to a thin film thickness on the substrate W.

Figure 16:
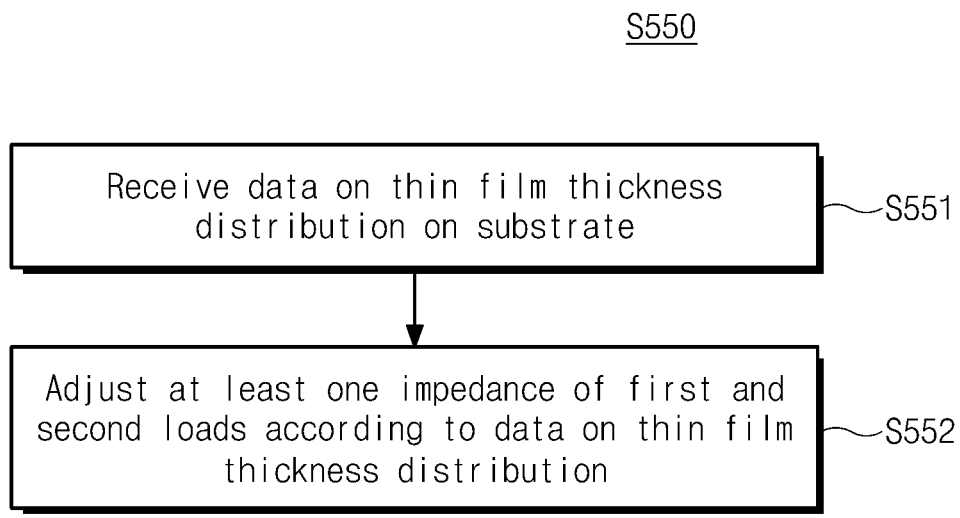
FIGS. 16 and 17 are flowcharts illustrating an operation for adjusting at least one impedance of a first load and a second load according to a thin film thickness on a substrate according to an embodiment of the present invention.

FIG. 16 is a flowchart illustrating operation S550 for adjusting at least one impedance of the first load 3141 and the second load 3142 according to a thin film thickness on the substrate W according to an embodiment of the present invention.

As shown in FIG. 16, operation S550 for adjusting at least one impedance of the first load 3141 and the second load 3142 according to a thin film thickness on the substrate W includes operation S551 for receiving data on a thin film thickness distribution on the substrate W and operation S552 for adjusting at least one of the first load 3141 and the second load 3142 according to the data on the thin film thickness distribution.

Operation S551 for receiving data on a thin film thickness distribution on the substrate W may include receive the thickness of a thin film formed in the center area W1 of the substrate W and the thickness of a thin film formed in the edge area W2 of the substrate W.

According to an embodiment of the present invention, operation S551 may include receiving the thickness d1 of a thin film formed in the center area W1 of the substrate W and the thickness d2 of a thin film formed in the edge area W2 of the substrate W. According to another embodiment of the present invention, operation S551 includes receiving the thicknesses of a thin film formed at a plurality of points on the substrate W as shown in FIGS. 9 and 10.

Figure 17:
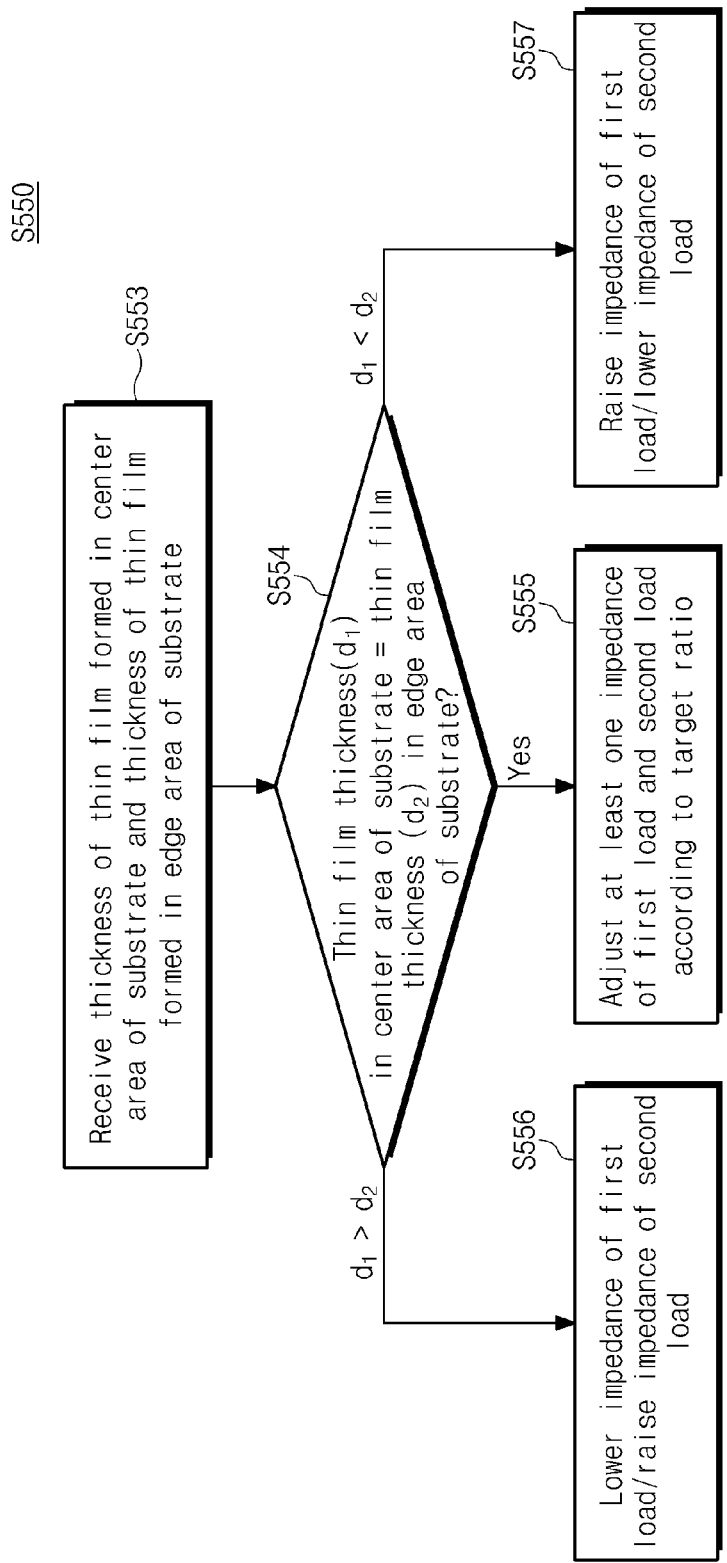

FIG. 17 is a flowchart illustrating operation S550 for adjusting at least one impedance of a first load and a second load according to a thin film thickness on the substrate W according to an embodiment of the present invention.

As shown in FIG. 17, operation S550 may include operation S553 for receiving an input on the thickness of a thin film formed in the center area W1 of the substrate W and the thickness of thin film formed in the edge area W2 of the substrate W, operation S556 for lowering the impedance of the first load 3141 or raising the impedance of the second load 3142 when the thickness of a thin film formed in the center area W1 of the substrate W is greater than the thickness of a thin film formed in the edge area W2 of the substrate W and operation S557 for raising the impedance of the first load 3141 or lowering the impedance of the second load 3142 when the thickness of a thin film formed in the edge area W2 of the substrate W is greater than the thickness of a thin film formed in the center area W1 of the substrate W.

As a result, if the thickness of a thin film formed in the center area W1 of the substrate W is greater than the thickness of a thin film formed in the edge area W2 of the substrate W, the density of plasma generated from the center area W1 of the substrate W may be higher than the density of plasma generated from the edge area W2.

On the contrary, if the thickness of a thin film formed in the edge area W2 of the substrate W is greater than the thickness of a thin film formed in the center area W1 of the substrate W, the density of plasma generated from the edge area W2 of the substrate W may be higher than the density of plasma generated from the center area W1.

According to the above-mentioned embodiment of the present invention, the method of controlling a plasma generating unit may adjust a power supplied to the first and second electromagnetic inducers 3131 and 3132 by adjusting the impedances of the first and second loads 3141 and 3142 connected to the input terminals of the first and second electromagnetic inducers 3131 and 3132. According to an embodiment of the present invention, the method of controlling a plasma generating unit may apply a balanced voltage to the first and second electromagnetic inducers 3131 and 3132 by adjusting the impedances of the third and fourth loads 3161 and 3162 connected to the ground terminals of the first and second electromagnetic inducers 3131 and 3132.

Figure 18:
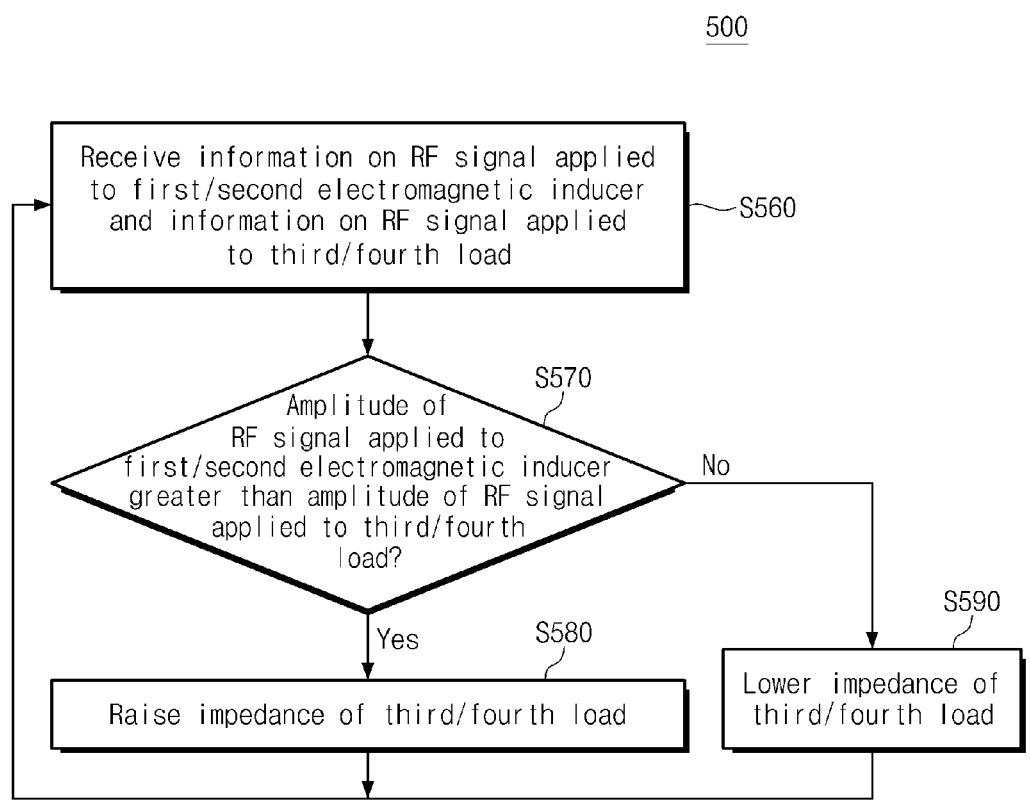
FIG. 18 is a flowchart illustrating a method of controlling a plasma generating unit according to an embodiment of the present invention.

FIG. 18 is a flowchart illustrating a method of controlling a plasma generating unit according to an embodiment of the present invention.

As shown in FIG. 18, the method 500 of controlling a plasma generating unit includes operation S560 for receiving information on an RF signal applied to the first and second electromagnetic inducers 3131 and 3132 and information on the third and fourth loads 3161 and 3162 connected to the ground terminals of the first and second electromagnetic inducers 3131 and 3132, operation S570 for comparing an RF signal applied to the first and second electromagnetic inducers 3131 and 3132 with an RF signal applied to the third and fourth loads 3161 and 3162, and operations S580 and S590 for adjusting the impedances of the third and fourth loads 3161 and 3162 according to a comparison result.

The method 500 of controlling a plasma generating unit may be performed by the controller 315 in the plasma generating unit 300. A program executing the method 500 of controlling a plasma generating unit may be stored in a storage unit (for example, HDD, SDD, memory, and recording medium) connected to the controller 315. The controller 315 may read the program from the storage unit and execute the method 500 of controlling a plasma generating unit.

The controller 315 may be configured using a processor, for example, a CPU, for reading and executing the program.

Operation S560 for receiving the information on the RF signal includes receiving information on RF signals applied to the first and second electromagnetic inducers 3131 and 3132 from the RF signal detection unit 318 connected to the input terminals of the first and second electromagnetic inducers 3131 and 3132 and receiving information on RF signals applied to the third and fourth loads 3161 and 3162 from the RF signal detection unit 318 connected to the input terminals of the third and fourth loads 3161 and 3162. The information on RF signal from the RF signal detection unit may include at least one of the amplitude, frequency, and phase of an RF signal.

Operation S570 for comparing the RF signals may include comparing a voltage magnitude of an RF signal applied to the first and second electromagnetic inducers 3131 and 3132 with a voltage magnitude of an RF signal applied to the third and fourth loads 3161 and 3162. According to an embodiment of the present invention, operation S570 for comparing the RF signals may compare an average voltage of an RF signal and the magnitude of an rms voltage and may also compare a current of an RF signal.

As mentioned above, shown in FIG. 12, operations S580 and S590 for adjusting the impedances include operation 580 for raising the impedances of the third and fourth loads 3161 and 3162 if the voltage amplitude of an RF signal applied to the first and second electromagnetic inducers 3131 and 3132 is greater than the voltage amplitude of an RF signal applied to the third and fourth loads 3161 and 3162 (YES in operation S570).

Additionally, operations S580 and S590 for adjusting the impedances include operation 590 for lowering the impedances of the third and fourth loads 3161 and 3162 if the voltage amplitude of an RF signal applied to the first and second electromagnetic inducers 3131 and 3132 is less than the voltage amplitude of an RF signal applied to the third and fourth loads 3161 and 3162 (NO in operation S570).

According to an embodiment of the present invention, operations S560 to S590 may be repeatedly performed at a predetermined period. As a result, the potential difference across the both ends of an electromagnetic inducer may maintain 0 during a plasma processing operation.

Figure 19:
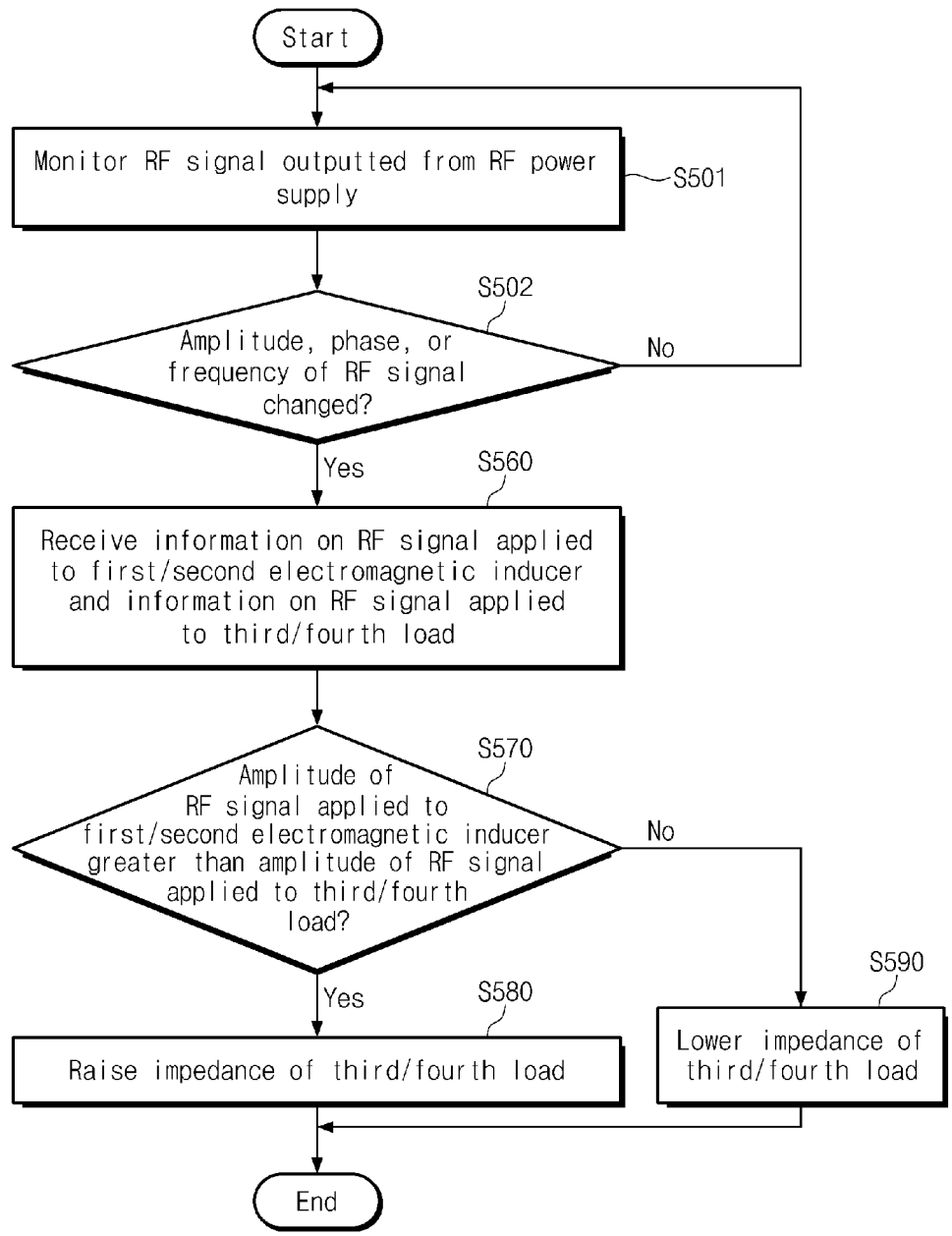
FIG. 19 is a flowchart illustrating a method of controlling a plasma generating unit according to another embodiment of the present invention.

FIG. 19 is a flowchart illustrating a method 500 of controlling a plasma generating unit according to another embodiment of the present invention.

According to the embodiment of FIG. 19, the method 500 of controlling a plasma generating unit may perform operations S560 to S590 when characteristics of an RF signal outputted from the RF power supply 311 change.

For example, the method 500 of controlling a plasma generating unit includes operation S501 for monitoring an RF signal from an RF power supply, operation S560 for receiving information on an RF signal applied to the first and second electromagnetic inducers 3131 and 3132 and information on an RF signal applied to the third and fourth loads 3161 and 3162 when at least one of the amplitude, phase, and frequency of the RF signal changes (YES in operation S502), and operations S580 and S590 for adjusting the impedances of the third and fourth loads 3161 and 3162 according to a comparison result.

The method 500 of controlling a plasma generating unit may adjust the impedances of the third and fourth loads 3161 and 3162 repeatedly according to a predetermined period as shown in FIG. 18 and, if the characteristics of an RF signal change, may perform an additional operation.

Figure 20:
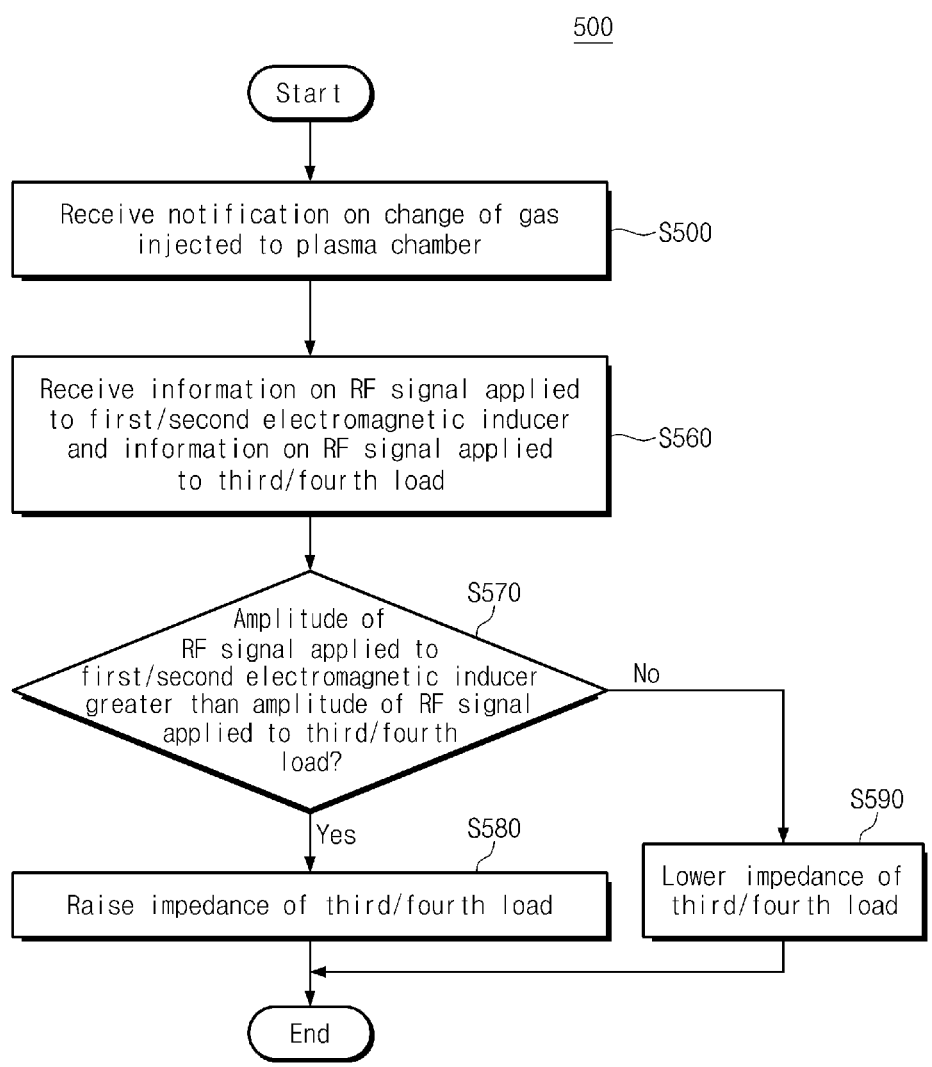
FIG. 20 is a flowchart illustrating a method of controlling a plasma generating unit according to another embodiment of the present invention.

FIG. 20 is a flowchart illustrating a method 500 of controlling a plasma generating unit according to another embodiment of the present invention.

According to the embodiment of FIG. 20, the method 500 of controlling a plasma generating unit may perform operations S560 to S590 when a gas injected to the plasma chamber 312 changes.

For example, as shown in FIG. 20, the method 500 of controlling a plasma generating unit includes operation S500 for receiving a notification on a change of a gas injected to the plasma chamber 312, operation S560 for receiving information on an RF signal applied to the first and second electromagnetic inducers 3131 and 3132 and information on an RF signal applied to the third and fourth loads 3161 and 3162, operation S570 for comparing an RF signal applied to the first and second electromagnetic inducers 3131 and 3132 with an RF signal applied to the third and fourth loads 3161 and 3162, and operations S580 and S590 for adjusting the impedances of the third and fourth loads 3161 and 3162 according to a comparison result.

Operation S500 for receiving the notification may include receiving information for notifying that at least one of the Ingredient, composition, and pressure of a gas injected to the plasma chamber 312 changes.

The method 500 of controlling a plasma generating unit may adjust the impedances of the third and fourth loads 3161 and 3162 repeatedly according to a predetermined period as shown in FIG. 18 and, if the characteristics of a gas injected to a chamber change, may perform an additional operation.

The method 500 of controlling a plasma generating unit may be implemented with a program to be executed on a computer and stored on a computer readable recording medium. The computer readable recording medium includes all kinds of storage devices where data readable by a computer system is stored. Examples of a computer readable recording medium may include ROM, RAM, CD-ROM, a magnetic tape, a floppy disk, and an optical data storage device.

According to an embodiment of the present invention, the uniformity of plasma generated in a chamber may be adjusted.

According to an embodiment of the present invention, the uniformity of plasma generated in a chamber may be adjusted and thus, the yield of a substrate processing process may be improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A plasma generating device comprising:
at least one RF power supply configured to supply one or more RF signals;
a plasma chamber providing a space where gas is injected to generate plasma;
a first electromagnetic inducer at one portion of the plasma chamber, the first electromagnetic inducer configured to induce an electromagnetic field in the plasma chamber as one of the one or more RF signals is applied;
a second electromagnetic inducer at another portion of the plasma chamber, the second electromagnetic inducer configured to induce an electromagnetic field in the plasma chamber as one of the one or more RF signals is applied;
a first load connected to the first electromagnetic inducer;
a second load connected to the second electromagnetic inducer;
at least one of a measurement unit and a detection unit, the measurement unit configured to measure at least one of capacitance, inductance, and resistance of the first and second loads, the detection unit configured to detect the one or more RF signals applied to the first and second electromagnetic inducers; and
a controller configured to respectively control a power supplied to the first electromagnetic inducer and a power supplied to the second electromagnetic inducer by adjusting at least one of an impedance of the first load and an impedance of the second load based on output from the at least one of the measurement unit and the detection unit.

2. The device of claim 1, wherein the plasma chamber comprises first and second pillar parts having different sizes of bottoms.

3. The device of claim 2, wherein
the first pillar part has a smaller bottom than the second pillar part;
the first electromagnetic inducer is at the first pillar part; and
the second electromagnetic inducer is at the second pillar part.

4. The device of claim 3, wherein the controller is configured to supply a greater power to the first electromagnetic inducer as compared to the second electromagnetic inducer.

5. The device of claim 3, wherein the controller is configured to control the power supplied to the first electromagnetic inducer and the power supplied to the second electromagnetic inducer according to a thickness of a thin film formed on a substrate using the plasma.

6. The device of claim 1, wherein at least one of the first electromagnetic inducer and the second electromagnetic inducer comprises a coil wound to an outer of the plasma chamber.

7. The device of claim 1, wherein the first electromagnetic inducer and the second electromagnetic inducer are in parallel with each other.

8. The device of claim 1, wherein:
the first load comprises a first variable capacitor connected to an input terminal of the first electromagnetic inducer; and
the second load comprises a second variable capacitor connected to an input terminal of the second electromagnetic inducer.

9. The device of claim 8, wherein when the measurement unit measures capacitances of the first and second variable capacitors, the controller is configured to calculate impedances of the first load and the second load on the basis of the measured capacitances.

10. The device of claim 1, wherein when the plasma generating device includes the detection unit, the controller is configured to calculate the power supplied to the first electromagnetic inducer and the power supplied to the second electromagnetic inducer on the basis of the output from the detection unit.

11. The device of claim 1, further comprising:
a third load connected to a ground terminal of the first electromagnetic inducer; and
a fourth load connected to a ground terminal of the second electromagnetic inducer.

12. The device of claim 11, wherein
the third load comprises a third variable capacitor whose capacitance is configured to be adjusted by the controller; and
the fourth load comprises a fourth variable capacitor whose capacitance is configured to be adjusted by the controller.

13. The device of claim 11, wherein the controller is configured to:
adjust an impedance of the third load to be half of the impedance of the first electromagnetic inducer; and
adjust an impedance of the fourth load to be half of the impedance of the second electromagnetic inducer.

14. A plasma generating device comprising:
at least one RF power supply configured to supply one or more RF signals;
a plasma chamber providing a space where gas is injected to generate plasma;
a first electromagnetic inducer at one portion of the plasma chamber, the first electromagnetic inducer configured to induce an electromagnetic field in the plasma chamber as one of the one or more RF signals is applied;
a second electromagnetic inducer at another portion of the plasma chamber, the second electromagnetic inducer configured to induce an electromagnetic field in the plasma chamber as one of the one or more RF signals is applied;
a first load connected to the first electromagnetic inducer;
a second load connected to the second electromagnetic inducer; and
a controller configured to respectively control a power supplied to the first electromagnetic inducer and a power supplied to the second electromagnetic inducer by adjusting at least one of an impedance of the first load and an impedance of the second load, the controller is further configured to,
increase the power supplied to the first electromagnetic inducer and reduce the power supplied to the second electromagnetic inducer when the thickness of the thin film formed in a center area of the substrate is greater than the thickness of the thin film formed in an edge area of the substrate, and
reduce the power supplied to the first electromagnetic inducer and increase the power supplied to the second electromagnetic inducer when the thickness of the thin film formed in the edge area of the substrate is greater than the thickness of the thin film formed in the center area of the substrate.

15. A plasma generating device comprising:
at least one RF power supply configured to supply one or more RF signals;
a plasma chamber providing a space where gas is injected to generate plasma;
a first electromagnetic inducer at one portion of the plasma chamber, the first electromagnetic inducer configured to induce an electromagnetic field in the plasma chamber as one of the one or more RF signals is applied;
a second electromagnetic inducer at another portion of the plasma chamber, the second electromagnetic inducer configured to induce an electromagnetic field in the plasma chamber as one of the one or more RF signals is applied;
a first load connected to the first electromagnetic inducer;
a second load connected to the second electromagnetic inducer;
a third load connected to a ground terminal of the first electromagnetic inducer;
a fourth load connected to a ground terminal of the second electromagnetic inducer; and
a controller configured to respectively control a power supplied to the first electromagnetic inducer and a power supplied to the second electromagnetic inducer by adjusting at least one of an impedance of the first load and an impedance of the second load, the controller further configured to,
first compare the RF signal applied to the first electromagnetic inducer with an RF signal applied to the third load and adjust an impedance of the third load according to the first comparison result, and
second compare the RF signal applied to the second electromagnetic inducer with an RF signal applied to the fourth load and adjust an impedance of the fourth load according to the second comparison result.

16. The device of claim 15, wherein the controller is configured to:
compare an amplitude of the RF signal applied to the first electromagnetic inducer with an amplitude of the RF signal applied to the third load; and
compare an amplitude of the RF signal applied to the second electromagnetic inducer with an amplitude of the RF signal applied to the fourth load.

17. The device of claim 16, wherein the controller is configured to:
when the amplitude of the RF signal applied to the first electromagnetic inducer is greater than the amplitude of the RF signal applied to the third load, increase an impedance of the third load;
when the amplitude of the RF signal applied to the first electromagnetic inducer is less than the amplitude of the RF signal applied to the third load, reduce the impedance of the third load;
when the amplitude of the RF signal applied to the second electromagnetic inducer is greater than the amplitude of the RF signal applied to the fourth load, increase an impedance of the fourth load; and
when the amplitude of the RF signal applied to the second electromagnetic inducer is less than the amplitude of the RF signal applied to the fourth load, reduce the impedance of the fourth load.

18. A substrate processing device comprising:
a process unit providing a space, the process unit configured to perform a plasma process on a substrate;
a plasma generating unit configured to generate plasma from gas and supply the plasma to the process unit; and
a discharge unit configured to discharge a process gas and a reaction by-product from the process unit,
wherein the plasma generating unit includes,
at least one RF power supply configured to supply one or more RF signals,
a plasma chamber providing a space where gas is injected to generate plasma,
a first electromagnetic inducer at one portion of the plasma chamber, the first electromagnetic inducer configured to induce an electromagnetic field in the plasma chamber as one of the one or more RF signals is applied,
a second electromagnetic inducer at another portion of the plasma chamber, the second electromagnetic inducer configured to induce an electromagnetic field in the plasma chamber as one of the one or more RF signals is applied,
a first load connected to the first electromagnetic inducer,
a second load connected to the second electromagnetic inducer, and
at least one of a measurement unit and a detection unit, the measurement unit configured to measure at least one of capacitance, inductance, and resistance of the first and second loads, the detection unit configured to detect the one or more RF signals applied to the first and second electromagnetic inducers, and
a controller configured to respectively control a power supplied to the first electromagnetic inducer and a power supplied to the second electromagnetic inducer by adjusting at least one of an impedance of the first load and an impedance of the second load based on one of the measured value and the detected value.

19. The device of claim 18, wherein the plasma chamber comprises first and second pillar parts having different sizes of bottoms.

20. The device of claim 19, wherein
the first pillar part has a smaller bottom than the second pillar part;
the first electromagnetic inducer is at the first pillar part; and
the second electromagnetic inducer is at the second pillar part.

21. The device of claim 20, wherein the controller is configured to supply a greater power to the first electromagnetic inducer as compared to the second electromagnetic inducer.

22. The device of claim 20, wherein the controller is configured to control the power supplied to the first electromagnetic inducer and the power supplied to the second electromagnetic inducer according to a thickness of a thin film formed on a substrate using the plasma.

23. The device of claim 18, wherein the first electromagnetic inducer and the second electromagnetic inducer are in parallel with each other.

24. The device of claim 18, wherein the first load comprises a first variable capacitor connected to an input terminal of the first electromagnetic inducer and the second load comprises a second variable capacitor connected to an input terminal of the second electromagnetic inducer.

25. The device of claim 24, wherein when the measurement unit is configured to measure capacitances of the first and second variable capacitors,
the controller is configured to calculate impedances of the first load and the second load on the basis of the measured capacitances.

26. The device of claim 18, wherein when the plasma generating device includes the detection unit, the controller is configured to calculate the power supplied to the first electromagnetic inducer and the power supplied to the second electromagnetic inducer on the basis of data inputted from the detection unit.

27. A substrate processing device comprising:
a process unit providing a space, the process unit configured to perform a plasma process on a substrate;
a plasma generating unit configured to generate plasma from gas and supply the plasma to the process unit; and
a discharge unit configured to discharge a process gas and a reaction by-product from the process unit,
wherein the plasma generating unit includes,
  at least one RF power supply configured to supply one or more RF signals,
  a plasma chamber providing a space where gas is injected to generate plasma,
  a first electromagnetic inducer at one portion of the plasma chamber, the first electromagnetic inducer configured to induce an electromagnetic field in the plasma chamber as one of the one or more RF signals is applied,
  a second electromagnetic inducer at another portion of the plasma chamber, the second electromagnetic inducer configured to induce an electromagnetic field in the plasma chamber as one of the one or more RF signals is applied,
  a first load connected to the first electromagnetic inducer,
  a second load connected to the second electromagnetic inducer, and
  a controller configured to respectively control a power supplied to the first electromagnetic inducer and a power supplied to the second electromagnetic inducer by adjusting at least one of an impedance of the first load and an impedance of the second load, the controller further configured to,
    increase the power supplied to the first electromagnetic inducer and reduce the power supplied to the second electromagnetic inducer when the thickness of the thin film formed in a center area of the substrate is greater than the thickness of the thin film formed in an edge area of the substrate, and
    reduce the power supplied to the first electromagnetic inducer and increase the power supplied to the second electromagnetic inducer when the thickness of the thin film formed in the edge area of the substrate is greater than the thickness of the thin film formed in the center area of the substrate.

* * * * *